(12) United States Patent
Seo et al.

(10) Patent No.: US 11,621,308 B2
(45) Date of Patent: Apr. 4, 2023

(54) DISPLAY DEVICE AND METHOD FOR FABRICATING THE SAME

(71) Applicant: Samsung Display Co., LTD., Yongin-si (KR)

(72) Inventors: Jung Han Seo, Hwaseong-si (KR); Woo Young Kim, Yongin-si (KR); Woo Yong Sung, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 243 days.

(21) Appl. No.: 17/164,877

(22) Filed: Feb. 2, 2021

(65) Prior Publication Data

US 2022/0005877 A1   Jan. 6, 2022

(30) Foreign Application Priority Data

Jul. 3, 2020   (KR) .......................... 10-2020-0081928

(51) Int. Cl.
*G06F 3/044*       (2006.01)
*G06F 3/041*       (2006.01)
(Continued)

(52) U.S. Cl.
CPC .......... *H01L 27/323* (2013.01); *G06F 3/0412* (2013.01); *G06F 3/0443* (2019.05);
(Continued)

(58) Field of Classification Search
CPC ..... G06F 3/0412; G06F 3/0443; G06F 3/0446
(Continued)

(56) References Cited

U.S. PATENT DOCUMENTS 10,739,929 B2 *    8/2020   Lee .................... G06F 3/04186
2015/0085456 A1 *  3/2015   Cok .................... H05K 1/0274
                                                                174/253
(Continued)

FOREIGN PATENT DOCUMENTS

KR   1020160013489 A    2/2016
KR   1020180116187 A    10/2018
(Continued)

OTHER PUBLICATIONS

Extended European Search Report—European Application No. 21178699.1 dated Dec. 2, 2021.

*Primary Examiner* — Calvin C Ma
(74) *Attorney, Agent, or Firm* — Cantor Colburn LLP

(57) ABSTRACT

A display device includes: a substrate including a front surface, side surfaces extending from sides of the front surface, and a corner between the side surfaces; a first display area at the front surface and including a first pixel electrode, a first emissive layer disposed on the first pixel electrode, and a first common electrode on the first emissive layer; a second display area at the corner and including a second pixel electrode, a second emissive layer on the second pixel electrode, and a second common electrode on the second emissive layer; a first inorganic encapsulation layer on the first common electrode and the second common electrode; an organic encapsulation layer on the first inorganic encapsulation layer in the first display area; and a second inorganic encapsulation layer on the organic encapsulation layer in the first display area and on the first inorganic encapsulation layer in the second display area.

21 Claims, 30 Drawing Sheets

(51) Int. Cl.
　　　*H01L 27/32*　　　(2006.01)
　　　*H01L 51/52*　　　(2006.01)
(52) U.S. Cl.
　　　CPC ........ *H01L 51/5253* (2013.01); *G06F 3/0446* (2019.05); *G06F 2203/04103* (2013.01)
(58) Field of Classification Search
　　　USPC ................................................ 345/173, 174
　　　See application file for complete search history.

(56)　　　　　　　　References Cited

U.S. PATENT DOCUMENTS

| | | |
|---|---|---|
| 2020/0106050 A1 | 4/2020 | Jeong et al. |
| 2020/0170126 A1 | 5/2020 | Ahn et al. |
| 2020/0287162 A1* | 9/2020 | Chung ................ H01L 27/3248 |

FOREIGN PATENT DOCUMENTS

| | | |
|---|---|---|
| KR | 1020190027986 A | 3/2019 |
| KR | 102075841 B1 | 2/2020 |

* cited by examiner

DISPLAY DEVICE AND METHOD FOR FABRICATING THE SAME

This application claims priority to Korean Patent Application No. 10-2020-0081928 filed on Jul. 3, 2020, and all the benefits accruing therefrom under 35 U.S.C. § 119, the content of which in its entirety is herein incorporated by reference.

BACKGROUND

1. Field

Embodiments of the invention relate to a display device and a method for fabricating the display device.

2. Description of the Related Art

As the information-oriented society evolves, various demands for display devices are ever increasing. Such display devices may be included in various electronic devices such as smart phones, digital cameras, laptop computers, navigation devices, and smart televisions, for example.

Display devices may be flat panel display devices such as a liquid-crystal display device, a field emission display device, and a light-emitting display device. Light-emitting display devices include an organic light-emitting display device including an organic light-emitting element, an inorganic light-emitting display device including an inorganic light-emitting element such as an inorganic semiconductor, and a micro-light-emitting display device including an ultra-small light-emitting element.

As display devices are employed by various electronic devices, display devices are desired to have various designs. In a case where the display device is a light-emitting display device, images may be displayed not only on the front surface but also on the side surfaces bent at the four edges of the front surface, respectively.

SUMMARY

In a display device where images are displayed not only on the front surface but also on the side surfaces bent at the four edges of the front surface, the display device may include a corner disposed between the first side surface bent at a first side edge of the front surface and the second side surface bent at a second side edge of the front surface. In such a display device, a high strain may be applied to the corner due to the double curvature, i.e., the curvature of the first side surface and the curvature of the second side surface.

Embodiments of the invention provide a display device where wen a corner of the display device includes cutout patterns and cutting grooves for reducing a strain at the corner and an organic layer for covering particles is formed only on the cutout patterns but not on the cutting grooves.

Embodiments of the invention provide a method of fabricating a display device, when a corner of the display device includes cutout patterns and cutting grooves for reducing a strain at the corner, and an organic layer for covering particles is formed only on the cutout patterns but not on the cutting grooves.

An embodiment of the invention provides a display device includes: a substrate including a front surface, a first side surface extending from a first side of the front surface, a second side surface extending from a second side of the front surface, and a corner disposed between the first side surface and the second side surface; a first display area disposed at the front surface of the substrate, where the first display area includes a first pixel including a first pixel electrode, a first emissive layer disposed on the first pixel electrode, and a first common electrode disposed on the first emissive layer; a second display area disposed at the corner of the substrate, where the second display area includes a second pixel including a second pixel electrode, a second emissive layer disposed on the second pixel electrode, and a second common electrode disposed on the second emissive layer; a first inorganic encapsulation layer disposed on the first common electrode in the first display area and the second common electrode in the second display area; an organic encapsulation layer disposed on the first inorganic encapsulation layer in the first display area; and a second inorganic encapsulation layer disposed on the organic encapsulation layer in the first display area and on the first inorganic encapsulation layer in the second display area.

In an embodiment, the display device may further include: an overcoat layer disposed on the second inorganic encapsulation layer in the first display area and the second display area; and a first touch inorganic layer disposed on the overcoat layer in the first display area and the second display area.

In an embodiment, the organic encapsulation layer may include a different material from the overcoat layer.

In an embodiment, the display device may further include: a connection electrode disposed on the first touch inorganic layer in the first display area; a second touch inorganic layer disposed on the connection electrode in the first display area; and a sensor electrode disposed on the second touch inorganic layer in the first display area.

In an embodiment, the sensor electrode may include a driving electrode and a sensing electrode, and the driving electrode may be connected to the connection electrode through a touch contact hole defined through the second touch inorganic layer.

In an embodiment, the display device may further include: a touch organic layer disposed on the sensor electrode in the first display area.

In an embodiment, the display device may further include: a cutout pattern disposed at the corner of the substrate, separated from another cutout pattern by a cutting groove, where the cutout pattern may include the second pixel.

In an embodiment, the display device may further include: a dam disposed on the cutout pattern and surrounding the second pixel.

In an embodiment, the second inorganic encapsulation layer and the first touch inorganic layer may be in contact with each other on the dam in the second display area.

In an embodiment, the second pixel may include a plurality of emission areas, and a dam hole may be defined between the dam and one of the plurality of emission areas.

In an embodiment, the dam hole may be filled with the overcoat layer.

In an embodiment, the display device may further include: a transistor disposed on the corner of the substrate in the second display area; a planarization layer disposed on the transistor; and a barrier layer disposed on the planarization layer. In such an embodiment, the dam hole may be defined through the planarization layer and the barrier layer.

In an embodiment, the dam hole may be formed into an undercut shape.

In an embodiment, the display device may further include: a first floating pattern disposed in the dam hole; and a second floating pattern disposed on the first floating pattern. In such an embodiment, the first inorganic encapsulation layer may be disposed on the second floating pattern in the dam hole.

In an embodiment, the first floating pattern may be spaced apart from the second emissive layer, the first floating pattern may include a same material as the second emissive layer, and the second floating pattern may be spaced apart from the second common electrode and includes a same material as the second common electrode.

In an embodiment, at least one selected from the first inorganic encapsulation layer, the second inorganic encapsulation layer, and the first touch inorganic layer may be disposed on a side surface of the cutout pattern.

An embodiment of the invention provides a method of fabricating a display device includes: providing a first pixel in a first display area and a second pixel in a second display area on a substrate, where the first pixel includes a first pixel electrode, a first emissive layer disposed on the first pixel electrode and a first common electrode disposed on the first emissive layer, and the second pixel includes a second pixel electrode, a second emissive layer disposed on the second pixel electrode and a second common electrode disposed on the second emissive layer; providing a first inorganic encapsulation layer on the first common electrode and the second common electrode; providing an organic encapsulation layer on the first inorganic encapsulation layer in the first display area; and providing a second inorganic encapsulation layer on the organic encapsulation layer in the first display area and the first inorganic encapsulation layer in the second display area.

In an embodiment, the providing the organic encapsulation layer may include: dropping a first organic material onto the first inorganic encapsulation layer in the first display area by an inkjet process to form the organic encapsulation layer.

In an embodiment, the method may further include: providing an overcoat layer on the second inorganic encapsulation layer in the first display area and the second display area; and providing a first touch inorganic layer on the overcoat layer in the first display area and the second display area.

In an embodiment, the providing the overcoat layer may include: applying a second organic material onto the second inorganic encapsulation layer in the first display area and the second display area to form the overcoat layer using a photolithography process.

In an embodiment, the first organic material may be different from the second organic material.

BRIEF DESCRIPTION OF THE DRAWINGS

These and/or other features of the invention will become apparent and more readily appreciated by describing in further detail embodiments thereof with reference to the accompanying drawings, in which.

DETAILED DESCRIPTION

Figure 1:
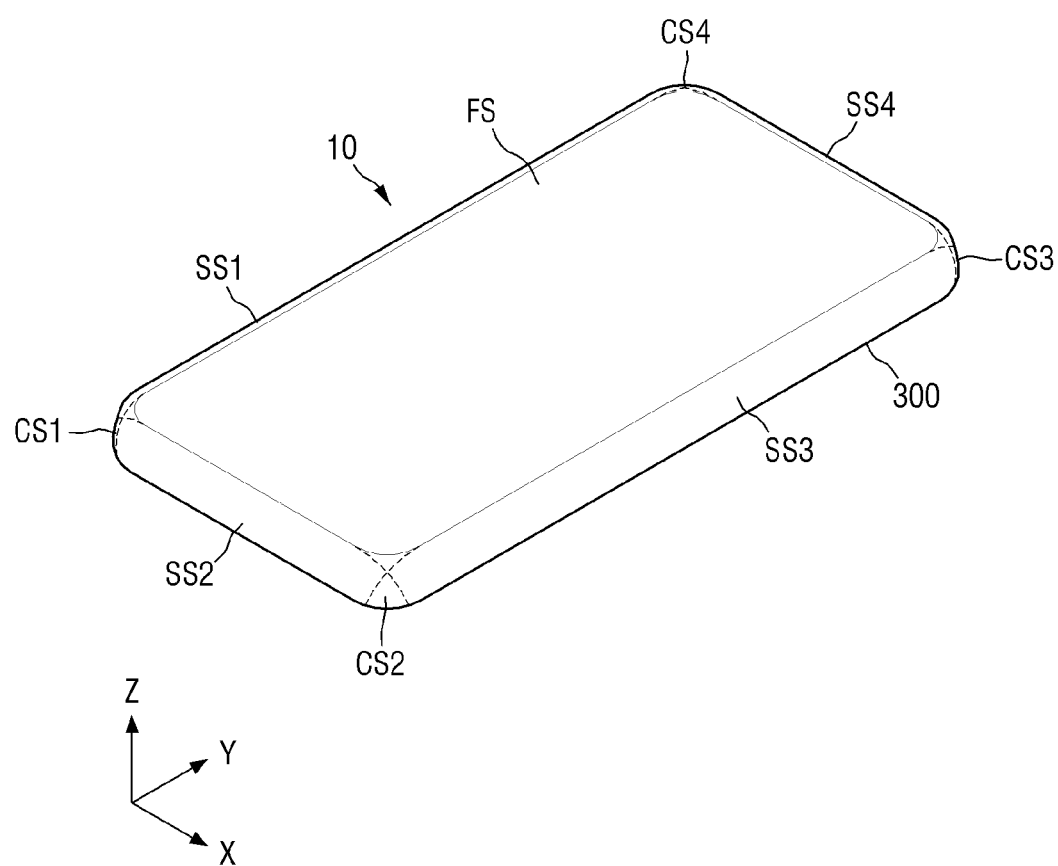
FIG. 1 is a perspective view of a display device according to an embodiment of the disclosure.

The invention will now be described more fully hereinafter with reference to the accompanying drawings, in which various embodiments of the invention are shown. The invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached drawing figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. A region illustrated or described as flat may, typically, have rough and/or nonlinear features, for example. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, embodiments of the disclosure will be described in detail with reference to the accompanying drawings.

Figure 2:
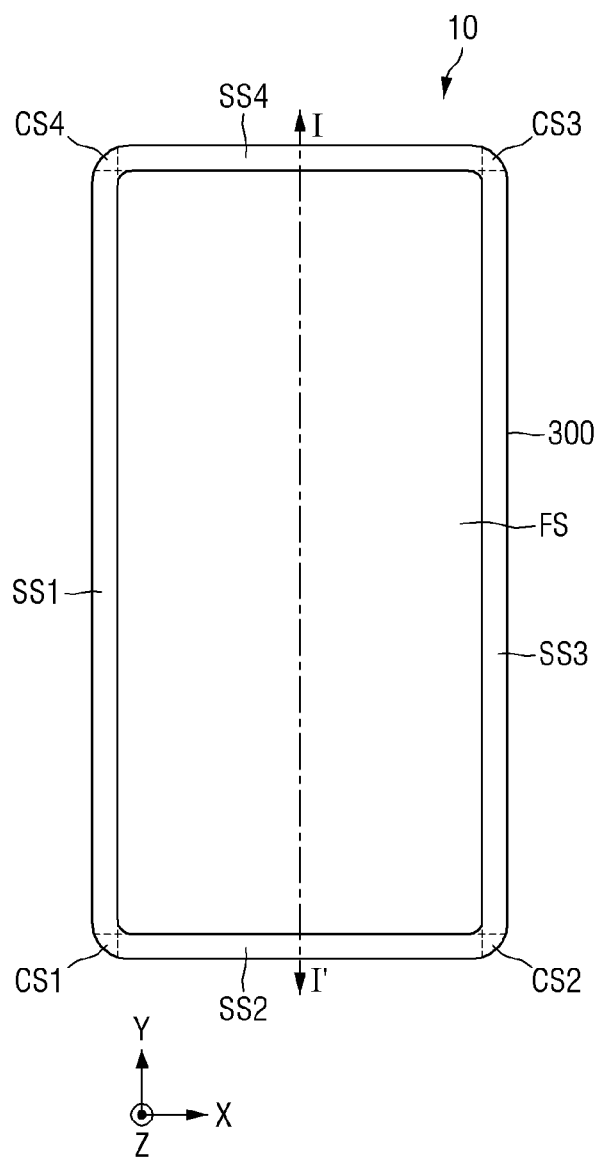
FIG. 2 is a plan view showing a display device according to an embodiment of the disclosure.

FIG. 1 is a perspective view of a display device according to an embodiment of the disclosure. FIG. 2 is a plan view showing a display device according to an embodiment of the disclosure.

Referring to FIGS. 1 and 2, an embodiment of a display device 10 may be a portable electronic device such as a mobile phone, a smart phone, a tablet personal computer ("PC"), a mobile communications terminal, an electronic notebook, an electronic book, a portable multimedia player ("PMP"), a navigation device and an ultra-mobile PC ("UMPC"). Alternatively, the display device 10 may be a display unit of a television, a laptop computer, a monitor, an electronic billboard, or the Internet of Things ("IOT"). Alternatively, the display device 10 may be a wearable device such as a smart watch, a watch phone, a glasses-type display, and a head-mounted display ("HMD") device. Alternatively, the display device 10 may be a center information display (CID) disposed at the instrument cluster, the center fascia or the dashboard of a vehicle, as a room mirror display on the behalf of the side mirrors of a vehicle, as a display placed on the back of each of the front seats that is an entertainment system for passengers at the rear seats of a vehicle.

As used herein, the first direction (X-axis direction) may be parallel to the shorter sides of the display device 10, for example, the horizontal direction of the display device 10 when viewed from the top. The second direction (Y-axis direction) may be parallel to the longer sides of the display device 10, for example, the vertical direction of the display device 10 when viewed from the top. The third direction (Z-axis direction) may refer to the thickness direction of the display device 10.

An embodiment of the display device 10 may include a display panel 300. In an embodiment, as shown in FIGS. 1 and 2, the display panel 300 may include a front surface FS, a first side surface SS1, a second side surface SS2, a third side surface SS3, a fourth side surface SS4, a first corner CS1, a second corner CS2, a third corner CS3, and a fourth corner CS4.

The display panel 300 may include a substrate which is flexible to be bent, folded, or rolled. In one embodiment, for example, the substrate SUB may include or be made of polyethersulphone ("PES"), polyacrylate ("PA"), polyacrylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP") or a combination thereof. Alternatively, the substrate SUB may include a metallic material. In an embodiment, only a part of the substrate SUB may be flexible, or the entire area of the substrate SUB may be flexible.

The front surface FS may have, but is not limited to, a rectangular shape having shorter sides in the first direction (X-axis direction) and longer sides in the second direction (Y-axis direction) when viewed from the top. The front surface FS may have another polygonal shape, a circular shape or an oval shape when viewed from the top or in the third direction (Z-axis direction). In an embodiment, as shown in FIGS. 1 and 2, the front surface FS may be flat, but the disclosure is not limited thereto. Alternatively, the front surface FS may include a curved surface.

The first side surface SS1 may extend from a first side of the front surface FS. The first side surface SS1 may be bent along a first bending line BL1 (see FIG. 3) on the first side of the front surface FS and accordingly may have a first curvature. The first side of the front surface FS may be the left side of the front surface FS as shown in FIGS. 1 and 2.

The second side surface SS2 may extend from a second side of the front surface FS. The second side surface SS2 may be bent along a second bending line BL2 (see FIG. 3) on the second side of the front surface FS and accordingly may have a second curvature. The second curvature may be different from the first curvature, but the disclosure is not limited thereto. The second side of the front surface FS may be the lower side of the front surface FS as shown in FIGS. 2 and 2.

The third side surface SS3 may extend from a third side of the front surface FS. The third side surface SS3 may be bent along a third bending line BL3 (see FIG. 3) on the third side of the front surface FS and accordingly may have a third curvature. The third curvature may be different from the second curvature, but the disclosure is not limited thereto. The third side of the front surface FS may be the right side of the front surface FS as shown in FIGS. 1 and 2.

The fourth side surface SS4 may extend from a fourth side of the front surface FS. The fourth side surface SS4 may be bent along a fourth bending line BL4 (see FIG. 3) on the fourth side of the front surface FS and accordingly may have a fourth curvature. The fourth curvature may be different from the first curvature, but the disclosure is not limited thereto. The fourth side of the front surface FS may be the upper side of the front surface FS as shown in FIGS. 1 and 2.

The first corner CS1 may be located between the first side surface SS1 and the second side surface SS2. In an embodiment, the first corner CS1 may be in contact with the lower side of the first side surface SS1 and the left side of the second side surface SS2. The first corner CS1 may have double curvature due to the first curvature of the first side surface SS1 and the second curvature of the second side surface SS2. Accordingly, a strain may be applied to the first corner CS1 by a bending force by the first curvature of the first side surface SS1 and by a bending force by the second curvature of the second side surface SS4.

The second corner CS2 may be located between the first side surface SS1 and the third side surface SS3. In an embodiment, the second corner CS2 may be in contact with the right side of the second side surface SS2 and the lower side of the third side surface SS3. The second corner CS1 may have double curvature due to the second curvature of the second side surface SS2 and the third curvature of the third side surface SS3. Accordingly, a strain may be applied to the second corner CS2 by a bending force by the second curvature of the second side surface SS2 and by a bending force by the third curvature of the third side surface SS3.

The third corner CS3 may be located between the third side surface SS3 and the fourth side surface SS4. In an embodiment, the third corner CS3 may be in contact with the upper side of the third side surface SS3 and the right side of the fourth side surface SS4. The third corner CS3 may have double curvature due to the third curvature of the third side surface SS3 and the fourth curvature of the fourth side surface SS4. Accordingly, a strain may be applied to the third corner CS3 by a bending force by the third curvature of the third side surface SS3 and by a bending force by the fourth curvature of the fourth side surface SS4.

The fourth corner CS4 may be located between the first side surface SS1 and the fourth side surface SS4. In an embodiment, the fourth corner CS4 may be in contact with the upper side of the first side surface SS1 and the left side of the fourth side surface SS4. The fourth corner CS4 may have double curvature due to the first curvature of the first side surface SS1 and the fourth curvature of the fourth side surface SS4. Accordingly, a strain may be applied to the fourth corner CS4 by a bending force by the first curvature of the first side surface SS1 and by a bending force by the fourth curvature of the fourth side surface SS4.

Figure 5:
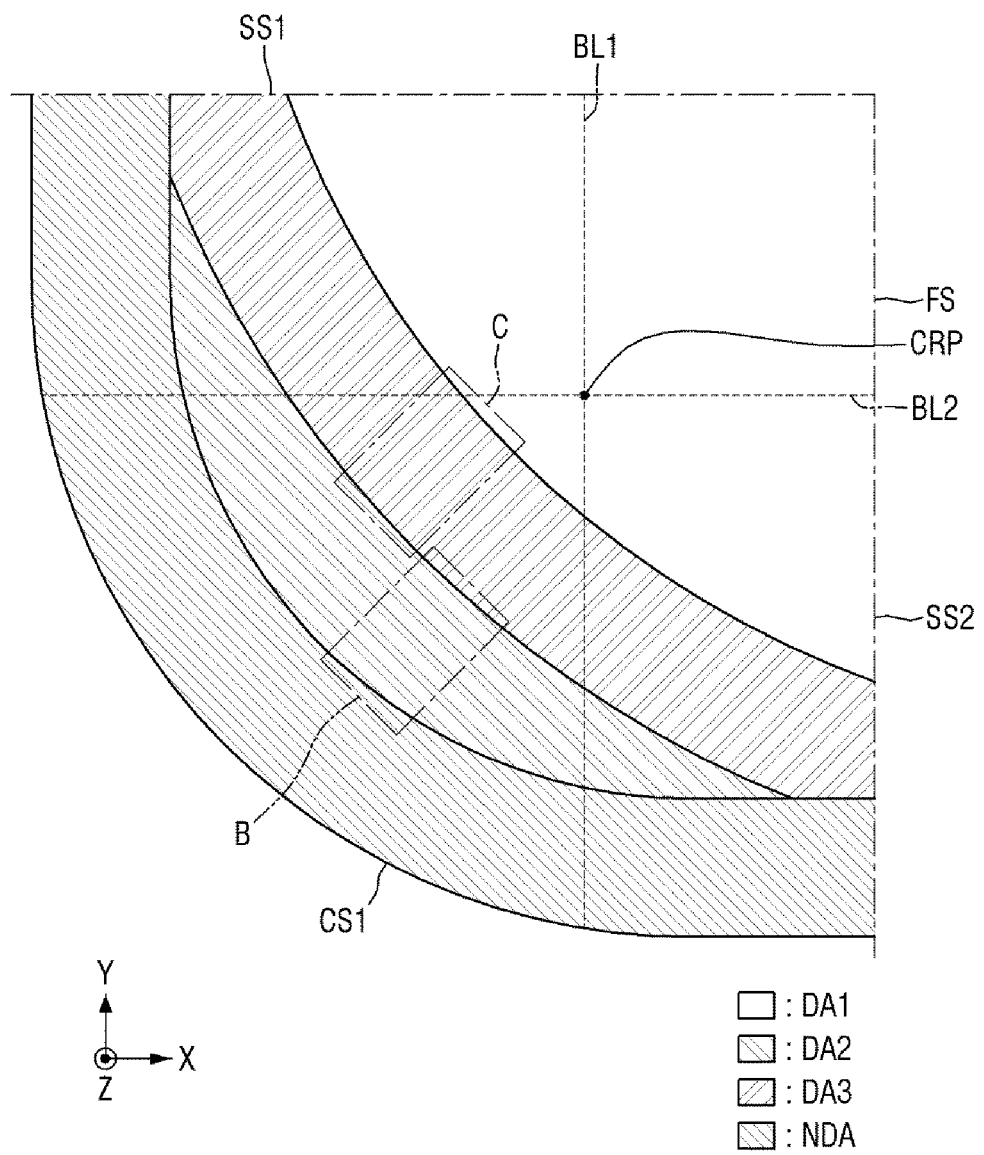
FIG. 5 is a plan view showing the first to third display areas and the non-display area disposed at the first corner of the display panel according to the embodiment of the disclosure.

Each of the first corner CS1, the second corner CS2, the third corner CS3 and the fourth corner CS4 may include cutout patterns that are separated by cutting grooves to reduce the strain due to the double curvature, as shown in FIG. 5. The cutout patterns will be described later in greater detail with reference to FIG. 5.

Figure 3:
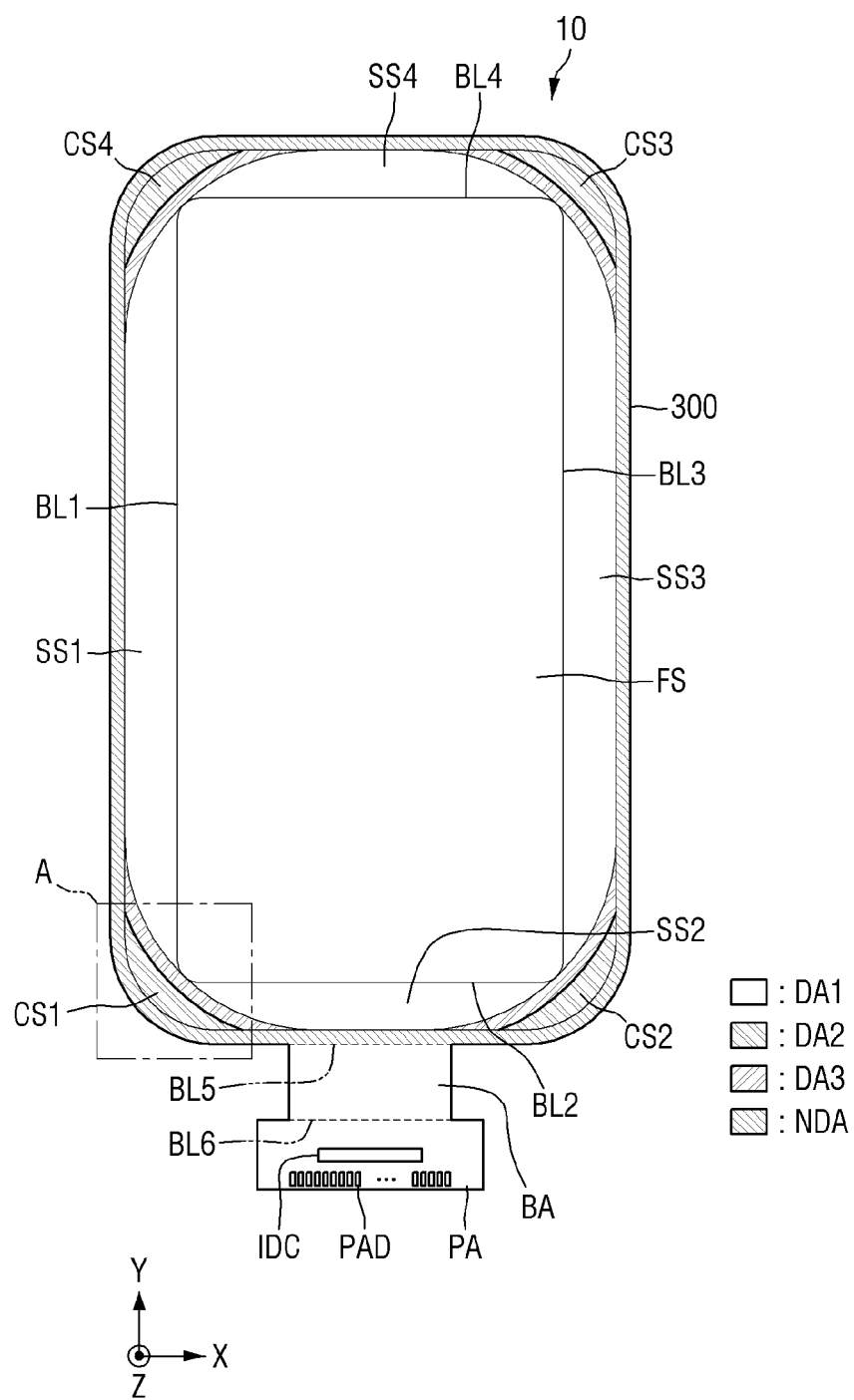
FIG. 3 is a development view showing a display device according to an embodiment of the disclosure.

FIG. 3 is a development view showing a display device according to an embodiment of the disclosure.

Referring to FIG. 3, an embodiment of the display panel 300 may further include a bending area BA and a pad area PA. The display panel 300 may include first to third display areas DA1 to DA3, a non-display area NDA, the bending area BA, and the pad area PA.

The first to third display areas DA1 to DA3 include pixels or emission areas to display images. The non-display area NDA does not include pixels or emission areas and does not display images. In the non-display area NDA, signal lines or driver circuits embedded in a panel for driving the pixels or the emission areas may be disposed.

The first display area DA1 may be the main display area of the display panel 300 and may include a front surface FS, a part of the first side surface SS1, a part of the second side surface SS2, a part of the third side part SS3 and a part of the side surface SS4. The part of the first side surface SS1 extends from the first side of the front surface FS, and the part of the second side surface SS2 extends from the second side of the front surface FS. The part of the third side surface SS3 extends from the third side of the front surface FS, and the part of the fourth side surface SS4 extends from the fourth side of the front surface FS. Each of the corners of the first display area DA1 may be rounded with a predetermined curvature.

Each of the second display areas DA2 may be a second auxiliary display area that assists the first display area DA1, i.e., the main display area. The resolution of each of the second display areas DA2 may be different from the resolution of the first display area DA1. In one embodiment, for example, where each of the second display areas DA2 serves to assist the first display area DA1, the resolution of each of the second display areas DA2 may be lower than that of the first display area DA1. In such an embodiment, the number of third emission areas per unit area in each of the second display areas DA2 may be smaller than the number of first emission areas per unit area in the first display area DA1. However, the disclosure is not limited thereto. In an alternative embodiment, the resolution of each of the second display areas DA2 may be substantially equal to the resolution of the first display area DA1.

The second display areas DA2 may be disposed on the outer side of the third display areas DA3, respectively. Accordingly, the third display areas DA3 may be disposed between the first display areas DA1 and the second display areas DA2, respectively. At least a part of each of the second display areas DA2 may be disposed at the respective one of the corners CS1 to CS4. In addition, at least a part of each of the second display areas DA2 may be disposed at two of the first to fourth side surfaces SS1 to SS4.

In one embodiment, for example, at least a part of the second display area DA2 disposed on the outer side of the corner where the lower side and the left side of the first display area DA1 meet may be disposed at the first corner CS1, the first side surface SS1 and the second side surface SS2. At least a part of the second display area DA2 disposed on the outer side of the corner where the lower side and the right side of the first display area DA1 meet may be disposed at the second corner CS2, the second side surface SS2 and the third side surface SS3. At least a part of the second display area DA2 disposed on the outer side of the corner where the upper side and the right side of the first display area DA1 meet may be disposed at the third corner CS3, the third side surface SS3 and the fourth side surface SS4. At least a part of the second display area DA2 disposed on the outer side of the corner where the upper side and the left side of the first display area DA1 meet may be disposed at the fourth corner CS4, the first side surface SS1 and the fourth side surface SS4.

Each of the third display areas DA3 may be a second auxiliary display area that assists the first display area DA1, i.e., the main display area. The resolution of each of the third display areas DA3 may be different from the resolution of the first display area DA1. In one embodiment, for example, where each of the third display areas DA3 serves to assist the first display area DA1, the resolution of each of the third display areas DA3 may be lower than that of the first display area DA1. In such an embodiment, the number of second emission areas per unit area in each of the third display areas DA3 may be smaller than the number of first emission areas per unit area in the first display area DA1. However, the disclosure is not limited thereto. Alternatively, the resolution of each of the third display areas DA3 may be substantially equal to the resolution of the first display area DA1.

Each of the third display areas DA3 may be disposed on the outer side of the respective one of the corners of the first display area DA1. At least a part of each of the third display areas DA3 may be disposed at the respective one of the corners CS1 to CS4. In addition, at least a part of each of the third display areas DA3 may be disposed on the front surface FS. In addition, at least a part of each of the third display areas DA3 may be disposed at two of the first to fourth side surfaces SS1 to SS4.

In one embodiment, for example, at least a part of the third display area DA3 disposed on the outer side of the corner where the lower side and the left side of the first display area DA1 meet may be disposed at the front surface FS, the first corner CS1, the first side surface SS1 and the second side surface SS2. At least a part of the third display area DA3 disposed on the outer side of the corner where the lower side and the right side of the first display area DA1 meet may be disposed at the front surface FS, the second corner CS, the second side surface SS2 and the third side surface SS3. At least a part of the third display area DA3 disposed on the outer side of the corner where the upper side and the right side of the first display area DA1 meet may be disposed at the front surface FS, the third corner CS3, the third side surface SS3 and the fourth side surface SS4. At least a part of the third display area DA3 disposed on the outer side of the corner where the upper side and the left side of the first display area DA1 meet may be disposed at the front surface FS, the fourth corner CS4, the first side surface SS1 and the fourth side surface SS4.

The non-display area NDA may include portions of the first side surface SS1, the second side surface SS2, the third side surface SS3, the fourth side surface SS4, the first corner CS1, the second corner CS2, the third corner CS3, and the fourth corner CS4. The non-display area NDA may be disposed on the outer sides of the first display area DA1 at the side surfaces SS1, SS2, SS3 and SS4. In one embodiment, for example, the non-display area NDA may be disposed at the left edge of the first side surface SS1, the lower edge of the second side surface SS2, the right edge of the third side surface SS3, and the upper edge of the fourth side surface SS4.

The non-display area NDA may be disposed on the outer sides of the second display areas DA2 at the corners CS1, CS2, CS3 and CS4. In one embodiment, for example, the non-display area NDA may be disposed at the edge of the corner where the upper side and the right side of the first corner CS1 meet, at the edge of the corner where the lower side and the right side of the second corner CS2 meet, at the edge of the corner where the upper side and the right side of the third corner CS3 meet, and at the edge of the corner where the upper side and the left side of the fourth corner CS4 meet.

The bending area BA may extend from the lower side of the second side surface SS2. The bending area BA may be disposed between the second side surface SS2 and the pad area PA. The length of the bending area BA in the first direction (X-axis direction) may be smaller than the length of the second side surface SS2 in the first direction (X-axis direction). The bending area BA may be bent along a fifth bending line BL5 on the lower side of the second side surface SS2.

The pad area PA may extend from the lower side of the bent area BA. The length of the pad area PA in the first direction (X-axis direction) may be larger than the length of the bending area BA in the first direction (X-axis direction). However, the disclosure is not limited thereto. Alternatively, the length of the pad area PA in the first direction (X-axis direction) may be substantially equal to the length of the bending area BA in the first direction (X-axis direction). The pad area PA may be bent along a sixth bending line BL6 on the lower side of the bending area BA. The pad area PA may be disposed on the lower side of the front surface FS.

An integrated driver circuit IDC and the pads PAD may be disposed on the pad area PA. The integrated driver circuit IDC may be implemented as an integrated circuit ("IC"). The integrated driver circuit IDC may be attached on the pad area PA by a chip on glass ("COG") technique, a chip on plastic ("COP") technique, or an ultrasonic bonding. Alternatively, the integrated driver circuit IDC may be disposed on a circuit board disposed on the pads PADs of the pad area PA.

The integrated driver IDC may be electrically connected to the pads PADs of the pad area PA. The integrated driver circuit IDC may receive digital video data and timing signals through the pads PADs of the pad area PA. The integrated driver circuit IDC may convert digital video data into analog data voltages and output them to the data lines of the display areas DA1, DA2, and DA3.

The circuit board may be attached on the pads PADs of the pad area PA using an anisotropic conductive film. In such an embodiment, the pads PADs of the pad area PA may be electrically connected to the circuit board.

In an embodiment, as shown in FIG. 3, the display areas DA1, DA2 and DA3 may be disposed at the front surface FS, the first side surface SS1, the second side surface SS2, the third side surface SS3, the fourth side surface SS4, the first corner CS1, the second corner CS2, the third corner CS3, and the fourth corner CS4. Therefore, images may be displayed not only on the front side FS, the first side surface SS1, the second side surface SS2, the third side surface SS3 and the fourth side surface SS4, but also on the first corner CS1, the second corner CS2, the third corner CS3 and the fourth corner CS4.

Figure 4:
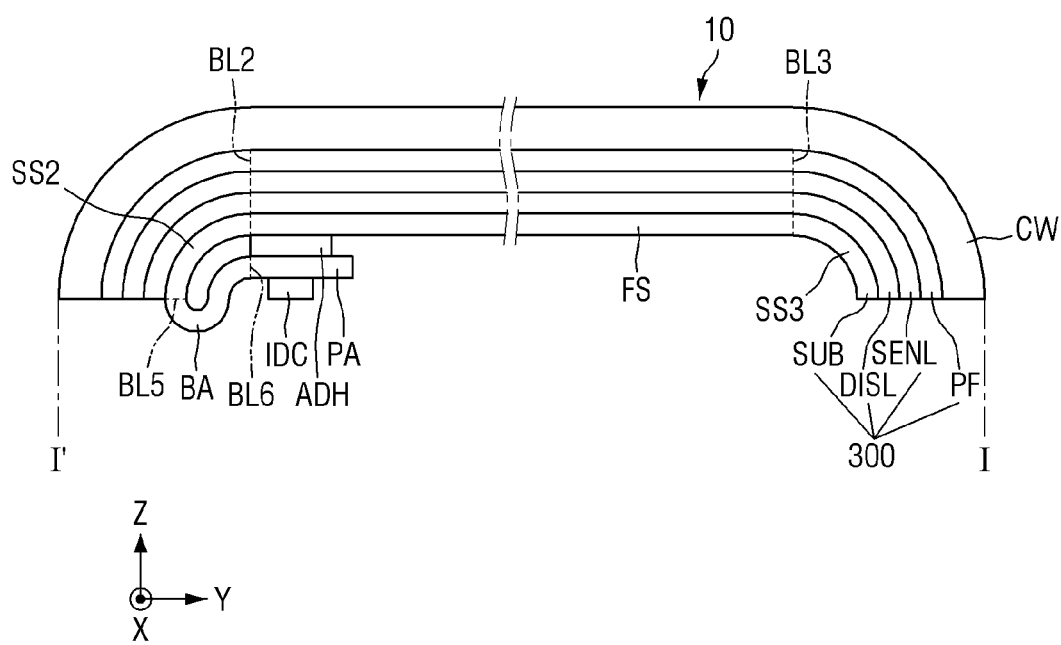
FIG. 4 is a cross-sectional view showing a display device according to an embodiment of the disclosure.

FIG. 4 is a cross-sectional view showing a display device according to an embodiment of the disclosure. FIG. 4 shows an embodiment of the display device 10, taken along line I-I' of FIG. 2.

Referring to FIG. 4, an embodiment of the display panel 300 may include a substrate SUB, a display layer DISL, a sensor electrode layer SENL, a polarizing film PF, and/or a cover window CW.

The display layer DISL may be disposed on the substrate SUB. The display layer DISL may include the display areas DA1, DA2 and DA3 (see FIG. 3) and the non-display area NDA. In such an embodiment, scan lines, data lines, power lines, etc. for driving light-emitting elements may be disposed in the display area DA of the display layer DISL in addition to the emission areas. In an embodiment, a scan driver circuit for outputting scan signals to the scan lines, fan-out lines for connecting the data lines with the integrated driver circuit IDC, etc. may be disposed in the non-display area NDA of the display layer DISL.

Figure 7:
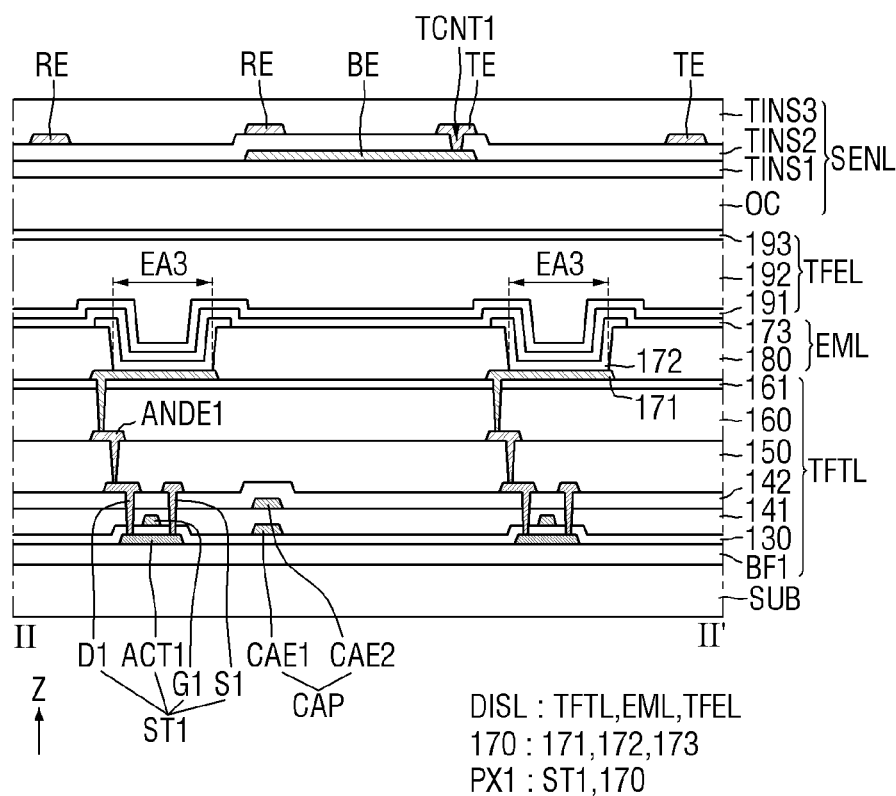
FIG. 7 is a cross-sectional view showing an embodiment of a display panel taken along line II-II' of FIG. 6.

The display layer DISL may include a thin-film transistor layer TFTL in which thin-film transistors are disposed, an emission material layer EML in which light-emitting elements emitting light are disposed in the emission areas, and an encapsulation layer TFEL for encapsulating the emission material layer, as shown in FIG. 7.

The sensor electrode layer SENL may be disposed on the display layer DISL. The sensor electrode layer SENL may include sensor electrodes. The sensor electrode layer SENL may sense a touch thereon by a person or an object using the sensor electrodes.

The polarizing film PF may be disposed on the sensor electrode layer SENL. The polarizing film PF may include a first base member, a linear polarizer, a retardation film such as a λ/4 (quarter-wave) plate, a λ/2 (half-wave) plate, and a second base member. In one embodiment, for example, the first base member, the linear polarizer, the λ/4 plate, the λ/2 plate, and the second base member may be sequentially stacked on the sensor electrode layer SENL.

The cover window CW may be disposed on the polarizing film PF. The cover window CW may be attached on the polarizing film PF by a transparent adhesive member such as an optically clear adhesive ("OCA") film and an optically clear resin ("OCR"). The cover window CW may include an inorganic material such as glass or an organic material such as plastic and polymer material.

The bending area BA may be bent along the fifth bending line BL5 and may be disposed on the lower surface of the second side surface SS2. The pad area PA may be bent along the sixth bending line BL6 and disposed on the lower surface of the front surface FS. The pad area PA may be attached to the lower surface of the front surface FS by an adhesive member ADH. The adhesive member ADH may be a pressure sensitive adhesive.

FIG. 5 is a plan view showing the first to third display areas and the non-display area disposed at the first corner of the display panel according to the embodiment of the disclosure. FIG. 5 is an enlarged view of area A of FIG. 3.

Referring to FIG. 5, in an embodiment of the display panel, a cross point CRP of the first bending line BL1 and the second bending line BL2 may be located in the first display area DA1. In such an embodiment, the first display area DA1 may be disposed on the front surface FS, the first side surface SS1, the second side surface SS2 and the first corner CS1. The third display area DA3 may be disposed on the first side surface SS1, the second side surface SS2, and the first corner CS1. The second display area DA2 may be disposed on the first side surface SS1, the second side surface SS2, and the first corner CS1. The non-display area NDA may be disposed on the first side surface SS1, the second side surface SS2, and the first corner CS1.

The position of the cross point CRP of the first bending line BL1 and the second bending line BL2 is not limited to that shown in FIG. 5 but may be located in the second display area DA2 or the third display area DA3.

The first display area DA1 may include first pixels PX1 that display an image (see FIG. 7). In addition, the first display area DA1 may include sensor electrodes SE for sensing a user's touch (see FIG. 7). The sensor electrodes SE may include driving electrodes TE and sensing electrodes RE (see FIG. 7).

The second display area DA2 may be disposed on the outer side of the third display area DA3. The non-display area NDA may be disposed on the outer side of the second display area DA2. The second display area DA2 may include second pixels PX2 that display an image (see FIGS. 8 to 11). In an embodiment, the second display area DA2 may include cutout patterns CP (see FIGS. 8 and 9) and cutting grooves CG (see FIGS. 8 and 9) to reduce the strain due to the double curvature at the first corner CS1. Alternatively, the second display area DA2 may include island patterns ISP (see FIGS. 10 and 11), connection patterns CNP (see FIGS. 10 and 11), and cutting parts CUP (see FIGS. 10 and 11) to reduce the strain due to the double curvature at the first corner CS1.

The third display area DA3 may be disposed on the outer side of the first display area DA1. The third display area DA3 may include third pixels PX3 that display an image (see FIG. 14).

In a case where a non-display area is formed instead of the third display area DA3, a user may recognize the non-display area between the first display area DA1 and the second display area DA2. In this case, the user may recognize a gap between the image displayed by the first display area DA1 and the image displayed by the second display area DA2. In an embodiment of the invention, where the third display area DA3 including third pixels PX3 (see FIG. 14) is formed between the first display area DA1 and the second display area DA2, a gap between the image displayed by the first display area DA1 and the image displayed by the second display area DA2 may be effectively prevented from being seen by the user.

The display areas DA1, DA2 and DA3 and the non-display area NDA disposed at the second corner CS2, the third corner CS3 and the fourth corner CS4 shown in FIG. 3 may be similar to those described above with respect to FIG. 5. Therefore, any repetitive detailed description of the second corner CS2, the third corner CS3 and the fourth corner CS4 will be omitted.

Figure 6:
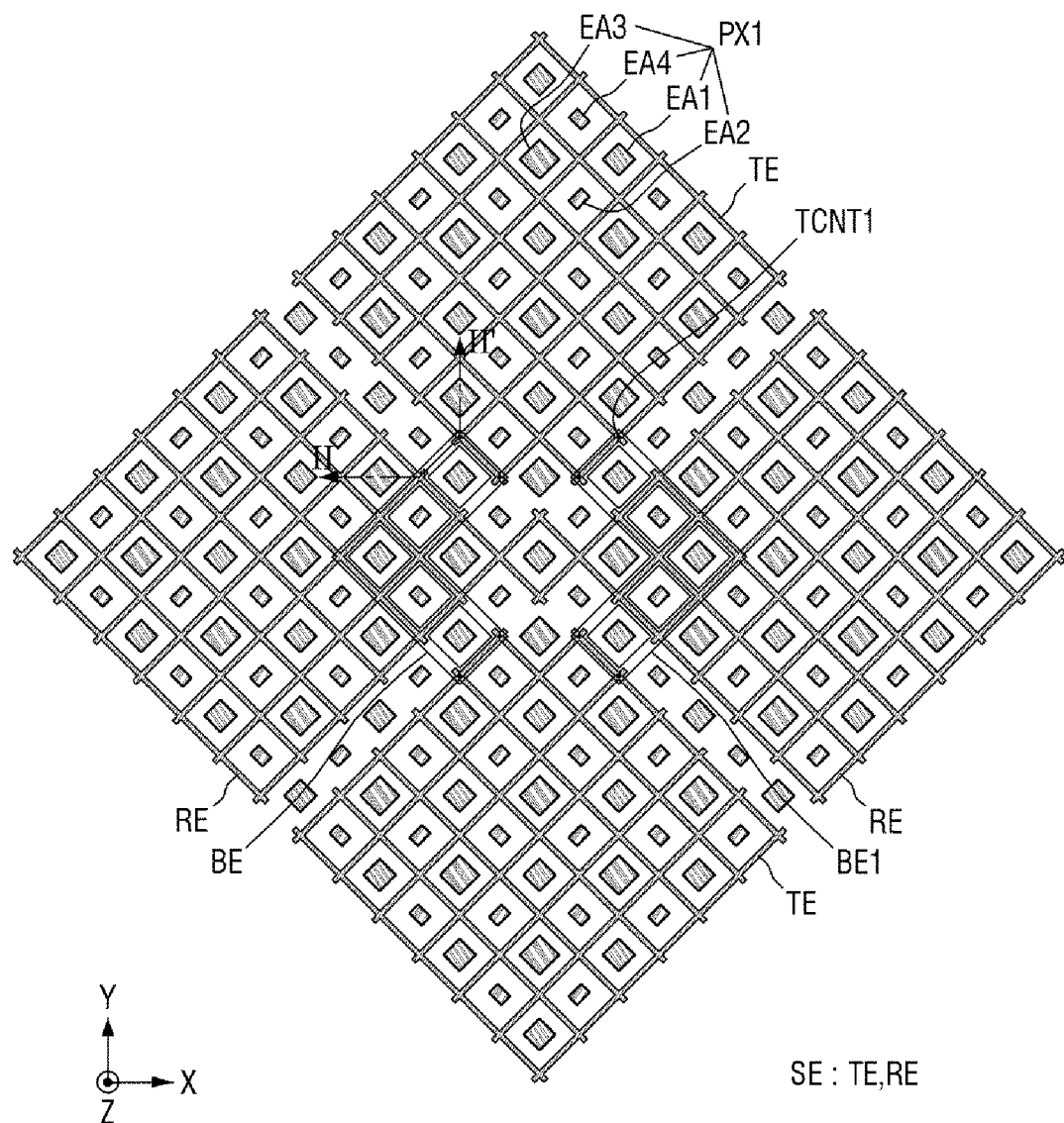
FIG. 6 is a plan view showing an embodiment of the first display area of FIG. 5.

FIG. 6 is a plan view showing an embodiment of the first display area of FIG. 5.

FIG. 6 shows the first pixels PX1 of the first display area DA1 and the driving electrodes TE and the sensing electrodes RE of the sensor electrode layer SENL (see FIG. 4). In an embodiment shown in FIG. 6, a user's touch is sensed by mutual capacitive sensing using two kinds of sensor electrodes, i.e., driving electrodes TE and sensing electrodes RE. For convenience of illustration, FIG. 6 shows only two sensing electrodes RE adjacent to each other in the first direction (X-axis direction) and two driving electrodes TE adjacent to each other in the second direction (Y-axis direction).

Referring to FIG. 6, in an embodiment, the driving electrodes TE may be electrically separated from the sensing electrodes RE. The driving electrodes TE and the sensing electrodes RE are disposed or formed in a same layer, and the driving electrodes TE and the sensing electrodes RE may be spaced apart from each other. In such an embodiment, a gap is defined between the driving electrodes TE and the sensing electrodes RE.

The sensing electrodes RE may be electrically connected to one another in the first direction (X-axis direction). The driving electrodes TE may be electrically connected to one another in the second direction (Y-axis direction). In an embodiment, the driving electrodes TE adjacent to one another in the second direction (Y-axis direction) may be connected through a connection electrodes BE to electrically separate the sensing electrodes RE from the driving electrodes TE at intersections therebetween.

The connection electrodes BE may be disposed or formed in a different layer from the driving electrodes TE and the sensing electrodes RE and may be connected to the driving electrodes TE through first touch contact holes TCNT1. One end of each of the connection electrodes BE may be connected to one of the driving electrodes TE adjacent to each other in the second direction (Y-axis direction) through the first touch contact hole TCNT1. The other end of each of the connection electrodes BE may be connected to another one of the driving electrodes TE adjacent to each other in the second direction (Y-axis direction) through the first touch contact hole TCNT1. The connection electrodes BE may overlap the sensing electrodes RE in the third direction (Z-axis direction). Since the connection electrodes BE are disposed or formed in a different layer from the driving electrodes TE and the sensing electrodes RE, the connection electrodes BE may be electrically separated from the sensing electrodes RE even though the connection electrodes BE overlap the sensing electrodes RE in the third direction (Z-axis direction).

Each of the connection electrodes BE may be bent at least once. In one embodiment, for example, the connection electrodes BE are bent in a shape of angle brackets "<" or ">" as shown in FIG. 6, but the shape of the connection electrodes BE is not limited thereto. In an embodiment, where the driving electrodes TE adjacent to each other in the second direction (Y-axis direction) are connected by a plurality of connection electrodes BEL the driving electrodes TE may be effectively electrically connected with each other even when any of the plurality of connection electrodes BE is disconnected.

Each of the driving electrodes TE and the sensing electrodes RE may have a mesh structure when viewed from the top or a plan view in the third direction (Z-axis direction). Since the driving electrodes TE and the sensing electrodes RE are disposed or formed on the thin-film encapsulation layer TFEL (see FIG. 8), the distance from a common electrode 173 (see FIG. 8) to the driving electrode TE or the sensing electrode RE is small. Therefore, a parasitic capacitance may be formed between the common electrode 173 (see FIG. 8) and the driving electrode TE or the sensing electrode RE. The parasitic capacitance is proportional to the area where the common electrode 173 (see FIG. 8) and the driving electrode TE or the sensing electrode RE overlaps each other. In an embodiment, it is desired that the driving electrodes TE and the sensing electrodes RE have a mesh structure when viewed from the top to reduce such parasitic capacitance.

The first display area DA1 may include the first pixels PX1 for displaying an image. Each of the first pixels PX1 may include a plurality of emission areas EA1, EA2, EA3 and EA4. In one embodiment, for example, each of the first pixels PX1 may include a first emission area EA1, a second emission area EA2, a third emission area EA3, and a fourth emission area EA4. The first emission area EA1 refers to an emission area of a first sub-pixel that emits a first light, and the second emission area EA2 refers to an emission area of a second sub-pixel that emits a second light. The third emission area EA3 refers to an emission area of a third sub-pixel that emits a third light, and the fourth emission area EA4 refers to an emission area of a fourth sub-pixel that emits a fourth light.

The first emission area EA1, the second emission area EA2, the third emission area EA3 and the fourth emission area EA4 may emit lights of different colors from each other.

Alternatively, two of the first emission area EA1, the second emission area EA2, the third emission area EA3 and the fourth emission area EA4 may emit light of a same color as each other. In one embodiment, for example, the first emission area EA1 may emit light of red color, the second emission area EA2 and the fourth emission area EA4 may emit light of green color, and the third emission area EA3 may emit light of blue color.

Each of the first emission area EA1, the second emission area EA2, the third emission area EA3 and the fourth emission area EA4 may have, but is not limited to, a quadrangular shape such as a diamond when viewed from the top. In one embodiment, for example, the first emission area EA1, the second emission area EA2, the third emission area EA3 and the fourth emission area EA4 may have another polygonal shape than a quadrangular shape, a circular shape, or an elliptical shape when viewed from the top. In an embodiment, as shown in FIG. 6, the third emission area EA3 has the largest area, the first emission area EA1 has the second largest area, and the second emission area EA2 and the fourth emission area EA4 have the smallest area, but not being limited thereto.

In an embodiment where the driving electrodes TE, the sensing electrodes RE and the connection electrodes BE are formed in a mesh structure when viewed from the top, the emission area EA1, EA2, EA3 and EA4 may not overlap the driving electrodes TE, the sensing electrodes RE and the connection electrodes BE in the third direction (Z-axis direction). In such an embodiment, the light emitted from the emission areas EA1, EA2, EA3 and EA4 is not or less blocked by the driving electrodes TE, the sensing electrodes RE and the connection electrodes BE1 the luminance of the light may be effectively prevented from being lowered by the electrodes.

FIG. 7 is a cross-sectional view showing an example of a display panel taken along line II-II' of FIG. 6.

Referring to FIG. 7, in an embodiment, the display layer DISL including the thin-film transistor layer TFTL, an emission material layer EML and an encapsulation layer TFEL may be disposed on the substrate SUB, and the sensor electrode layer SENL including the driving electrodes TE, the sensing electrodes RE and the connection electrodes BE may be disposed on the display layer DISL.

The substrate SUB may include or be made of an insulating material such as a polymer resin and glass. In one embodiment, for example, the substrate SUB may include PI. In such an embodiment, the substrate SUB may be a flexible substrate that may be bent, folded, or rolled.

The thin-film transistor layer TFTL including first thin-film transistors ST1 may be disposed on the substrate SUB. The thin-film transistor layer TFTL may include a first thin-film transistor ST1, a capacitor CAP, a first connection electrode ANDE1, a first buffer layer BF1, a gate insulator 130, a first interlayer dielectric layer 141, a second interlayer dielectric layer 142, a first planarization layer 150, a second planarization layer 160, and a barrier layer 161.

The first buffer layer BF1 may be disposed on the substrate SUB. The buffer layer BF1 may include or be formed of a silicon nitride layer, a silicon oxynitride layer, a silicon oxide layer, a titanium oxide layer, or an aluminum oxide layer.

The first thin-film transistor ST1 may be disposed on the first buffer layer BF1. The first thin-film transistor ST1 may include a first active layer ACT1, a first gate electrode G1, a first source electrode S1, and a first drain electrode D1.

The first active layer ACT1 of the first thin-film transistor ST1 may be disposed on the first buffer layer BF1. The first active layer ACT1 may include silicon semiconductor such as polycrystalline silicon, monocrystalline silicon, low-temperature polycrystalline silicon and amorphous silicon. The part of the first active layer ACT1 overlapping the first gate electrode G1 in the third direction (Z-axis direction) may be defined as a channel region. The other parts of the first active layer ACT1 not overlapping the first gate electrode G1 in the third direction (Z-axis direction) may be defined as conductive regions. The conductive regions of the first active layer ACT1 may have conductivity by doping a silicon semiconductor with ions or impurities.

A gate insulator 130 may be disposed on the first active layer ACT of the first thin-film transistor ST1. The gate insulator 130 may include or be formed of an inorganic layer, for example, a silicon nitride layer, a silicon oxynitride layer, a silicon oxide layer, a titanium oxide layer, or an aluminum oxide layer.

The first gate electrode G1 of the first thin-film transistor ST1 and a first capacitor electrode CAE1 may be disposed on the gate insulator 130. The first gate electrode G1 of the first thin-film transistor ST1 may overlap the first active layer ACT1 in the third direction (Z-axis direction). A first capacitor electrode CAE1 of the capacitor CAP may overlap a second capacitor electrode CAE2 of the capacitor CAP in the third direction (Z-axis direction). The first gate electrode G1 and the first capacitor electrode CAE1 may include or be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The first interlayer dielectric layer 141 may be disposed on the first gate electrode G1 and the first capacitor electrode CAE1. The first interlayer dielectric layer 141 may include or be formed of an inorganic layer, for example, a silicon nitride layer, a silicon oxynitride layer, a silicon oxide layer, a titanium oxide layer, or an aluminum oxide layer. The first interlayer dielectric layer 141 may include a number of inorganic layers.

The second capacitor electrode CAE2 may be disposed on the first interlayer dielectric layer 141. The second capacitor electrode CAE2 may overlap the first capacitor electrode CAE1 in the third direction (Z-axis direction). Since the first interlayer dielectric layer 141 has a predetermined dielectric constant, the capacitor CAP can be formed by the first capacitor electrode CAE1, the second capacitor electrode CAE2 and the first interlayer dielectric layer 141. The second capacitor electrode CAE2 may be made up of or defined by a single layer or multiple layers, each layer including molybdenum (Mo), aluminum (Al), chromium (Cr), gold (Au), titanium (Ti), nickel (Ni), neodymium (Nd) and copper (Cu) or an alloy thereof.

The second interlayer dielectric layer 142 may be disposed over the second capacitor electrode CAE2. The second interlayer dielectric layer 142 may include or be formed of an inorganic layer, for example, a silicon nitride layer, a silicon oxynitride layer, a silicon oxide layer, a titanium oxide layer, or an aluminum oxide layer.

The first source electrode S1 and the first drain electrode D1 of the first thin-film transistor ST1 may be disposed on the second interlayer dielectric layer 142. The first source electrode S1 and the first drain electrode D1 may be made up of or defined by a single layer including molybdenum (Mo), aluminum (Al), chromium (Cr), gold (Au), titanium (Ti), nickel (Ni), neodymium (Nd) and copper (Cu) or an alloy thereof, or multiple layers thereof.

The first source electrode S1 of the first thin-film transistor ST1 may be connected to the conductive region located on a side of the change region of the first active layer ACT1 through a contact hole defined through the gate insulator 130, the first interlayer dielectric layer 141 and the second interlayer dielectric layer 142. The first drain electrode D1 of the first thin-film transistor ST1 may be connected to the conductive region located on the opposite side of the change region of the first active layer ACT1 through a contact hole defined through the gate insulator 130, the first interlayer dielectric layer 141 and the second interlayer dielectric layer 142.

The first planarization layer 150 may be disposed on the first source electrode S1 and the first drain electrode D1 to provide a flat surface over the thin-film transistors having different levels or a step structure. The first planarization layer 150 may include or be formed of an organic layer such as an acryl resin, an epoxy resin, a phenolic resin, a polyamide resin and a polyimide resin.

The first connection electrode ANDE1 may be disposed on the first planarization layer 150. The first connection electrode ANDE1 may be connected to the first source electrode S1 or the first drain electrode D1 of the first thin-film transistor ST1 through a contact hole defined through the first planarization layer 150. The first connection electrode ANDE1 may be made up of or defined by a single layer or multiple layers, each layer including molybdenum (Mo), aluminum (Al), chromium (Cr), gold (Au), titanium (Ti), nickel (Ni), neodymium (Nd) and copper (Cu) or an alloy thereof.

The second planarization layer 160 may be disposed on the first connection electrode ANDE1. The second planarization layer 160 may include or be formed of an organic layer such as an acryl resin, an epoxy resin, a phenolic resin, a polyamide resin and a polyimide resin.

The barrier layer 161 may be disposed on the second planarization layer 160. The barrier layer 161 may include or be formed of a silicon nitride layer, a silicon oxynitride layer, a silicon oxide layer, a titanium oxide layer, or an aluminum oxide layer.

The emission material layer EML is disposed on the thin-film transistor layer TFTL. The emission material layer EML may include first light-emitting elements 170 and a bank 180.

Each of the first light-emitting elements 170 may include a first pixel electrode 171, a first emissive layer 172, and a first common electrode 173. In each of the emission areas EA1, EA2, E3 and E4, the first pixel electrode 171, the first emissive layer 172 and the first common electrode 173 are stacked sequentially one on another, so that holes from the first pixel electrode 171 and electrons from the first common electrode 173 are combined with each other in the first emissive layer 172 to emit light. In an embodiment, the first pixel electrode 171 may be an anode electrode while the first common electrode 173 may be a cathode electrode. The first emission area EA1, the second emission area EA2 and the fourth emission area EA4 may be substantially to the same as the third emission area EA3 shown in FIG. 7.

The first pixel electrode 171 may be disposed on the barrier layer 161. The first pixel electrode 171 may be connected to the first connection electrode ANDE1 through a contact hole defined through the barrier layer 161 and the second planarization layer 160.

In an embodiment, the first light-emitting elements 170 may have a top-emission structure where light exits from the first emissive layer 172 toward the first common electrode 173, and the first pixel electrode 171 may be made up of or defined by a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of APC alloy and ITO (ITO/APC/ITO) to increase the reflectivity. The APC alloy is an alloy of silver (Ag), palladium (Pd) and copper (Cu).

The bank 180 serves to define each of the emission areas E1, E2, E3 and E4 of display pixels. In such an embodiment, the bank 180 may be disposed or formed on the barrier layer 161 to expose a part of the first pixel electrode 171. The bank 180 may cover the edge of the first pixel electrode 171. The bank 180 may be disposed in a contact hole defined through the barrier layer 161 and the second planarization layer 160. Accordingly, the contact hole defined through the barrier layer 161 and the second planarization layer 160 may be filled with the bank 180. The bank 180 may include or be formed of an organic layer such as an acryl resin, an epoxy resin, a phenolic resin, a polyamide resin and a polyimide resin.

The first emissive layer 172 is disposed on the first pixel electrode 171. The first emissive layer 172 may include an organic material and emit light of a predetermined color. In one embodiment, for example, the first emissive layer 172 may include a hole transporting layer, an organic material layer, and an electron transporting layer. The organic material layer may include a host and a dopant. The organic material layer may include a material that emits a predetermined light, and may be formed using a phosphor or a fluorescent material.

The first common electrode 173 is disposed on the first emissive layer 172. The first common electrode 173 covers the first emissive layer 172. The first common electrode 173 may be a common layer formed across the display pixels. A capping layer may be formed on the first common electrode 173.

In an embodiment where the first light-emitting elements 170 have the top-emission structure, the first common electrode 173 may include or be formed of a transparent conductive material such as indium tin oxide ("ITO") and indium zinc oxide ("IZO") that can transmit light, or a semi-transmissive conductive material such as magnesium (Mg), silver (Ag) and an alloy of magnesium (Mg) and silver (Ag). In an embodiment, the first common electrode 173 may include or be formed of a semi-transmissive conductive material, such that the light extraction efficiency may be increased by microcavity effects.

The encapsulation layer TFEL may be disposed or formed on the emission material layer EML. The encapsulation layer TFEL may include an inorganic layer to prevent permeation of oxygen or moisture into the light-emitting element layer EML. In addition, the encapsulation layer TFEL may further include an organic layer to protect the emission material layer EML from particles.

In one embodiment, for example, the thin-film encapsulation layer TFEL may include a first inorganic encapsulation layer 191 disposed on the first common electrode 173, an organic encapsulation layer 192 disposed on the first inorganic encapsulation layer 191, and a second inorganic encapsulation layer 193 disposed on the organic encapsulation layer 192. The first inorganic encapsulation layer 191 and the second inorganic encapsulation layer 193 may be made up of or defined by multiple layers in which one or more inorganic layers of a silicon nitride layer, a silicon oxynitride layer, a silicon oxide layer, a titanium oxide layer and an aluminum oxide layer are alternately stacked on one another. The organic layer may include an acryl resin, an epoxy resin, a phenolic resin, a polyamide resin or a polyimide resin.

The sensor electrode layer SENL is disposed on the encapsulation layer TFEL. The sensor electrode layer SENL may include the driving electrodes TE, the sensing electrodes RE, and the connection electrodes BE.

An overcoat layer OC may be disposed on the encapsulation layer TFEL. The overcoat layer OC may include an inorganic layer. In one embodiment, for example, the overcoat layer OC may include or be formed of an organic material such as an acryl resin, an epoxy resin, a phenolic resin, a polyamide resin and a polyimide resin.

A first touch inorganic layer TINS1 may be disposed on the overcoat layer OC. The first touch inorganic layer TINS1 may be formed as or defined by a silicon nitride layer, a silicon oxynitride layer, a silicon oxide layer, a titanium oxide layer, or an aluminum oxide layer.

The connection electrodes BE may be disposed on the first touch inorganic layer TINS1. The connection electrodes BE may be made up of or defined by a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

A second touch inorganic layer TINS2 may be disposed on the connection electrodes BE. The second touch inorganic layer TINS2 may be formed as or defined by a silicon nitride layer, a silicon oxynitride layer, a silicon oxide layer, a titanium oxide layer, or an aluminum oxide layer.

The driving electrodes TE and the sensing electrodes RE may be disposed on the second touch inorganic layer TINS2. In an embodiment, the driving electrodes TE and the sensor electrodes RE may not overlap the emission areas EA1, EA2, EA3 and EA4 to prevent the light emitted from the emission areas EA1, EA2, EA3 and EA4 from being blocked by the driving electrodes TE and the sensing electrodes RE which may decrease the luminance of the light. The driving electrodes TE and the sensing electrodes RE may be made up of or defined by a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy, or a stack structure of an APC alloy and ITO (ITO/APC/ITO).

A touch organic layer TINS3 may be disposed on the driving electrodes TE and the sensing electrodes RE. The touch organic layer TINS3 may include at least one material selected from an acryl resin, an epoxy resin, a phenolic resin, a polyamide resin and a polyimide resin.

Figure 8:
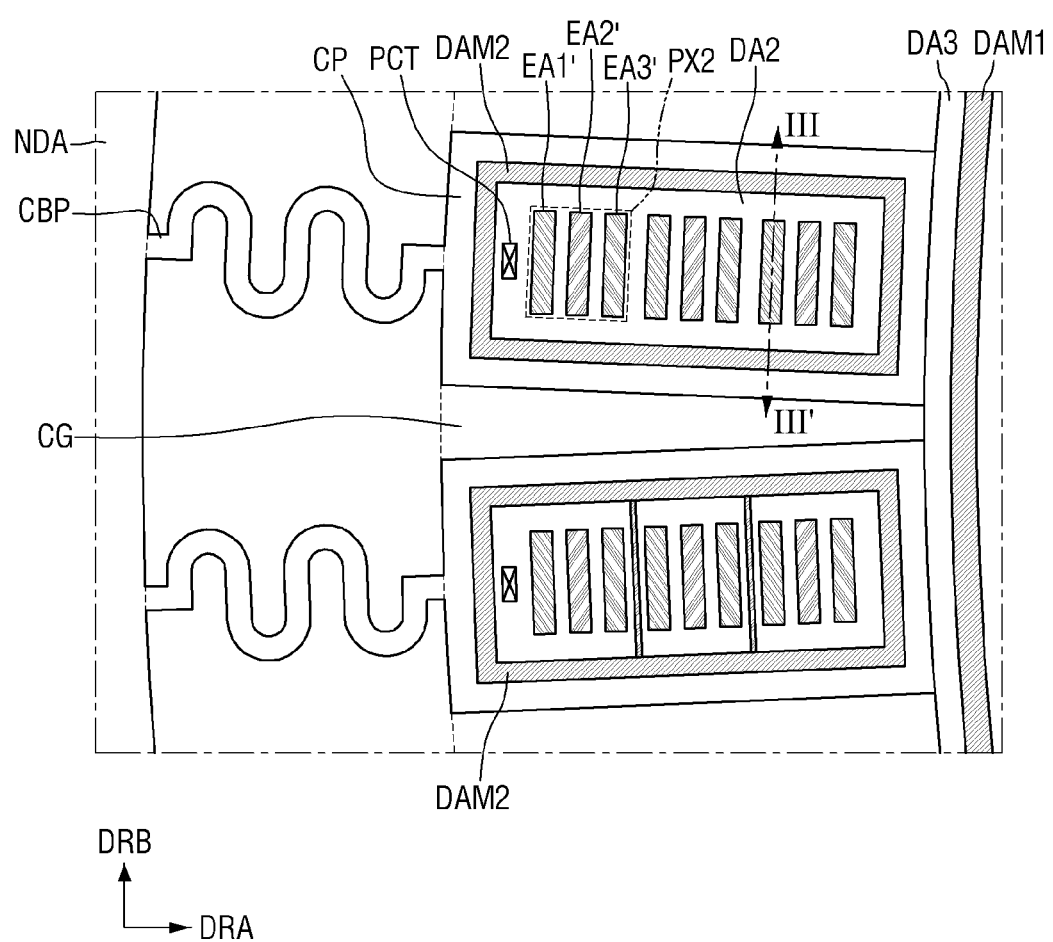
FIG. 8 is a plan view showing an embodiment of the second display area of FIG. 5.

FIG. 8 is a plan view showing an embodiment of the second display area of FIG. 5. FIG. 8 is an enlarged view of the area B in FIG. 5.

Referring to FIG. 8, the second display area DA2 may include cutout patterns CP and cutting grooves CG. The cutout patterns CP and cutout connection patterns CBP may be formed by cutting the display panel 300 with a laser. Accordingly, the cutting groove CG may exist between the cutout patterns CP adjacent to each other and between the cutout connection patterns CBP adjacent to each other.

One end of each of the cutout patterns CP may be connected to the third display area DA3, and the other end thereof may be connected to the cutout connection pattern CBP. Each of the cutout patterns CP may be formed in a shape similar to a quadrangular shape when viewed from the top.

The cutout connection patterns CBP may be disposed between the respective cutout patterns CP and the non-display area NDA. One end of each of the cutout connection patterns CBP may be connected to the respective cutout patterns CP and the other end thereof may be connected to the non-display area NDA.

The cutout connection patterns CBP may be in a serpentine shape including a plurality of bent or curved portions. In such an embodiment, the cutout connection patterns CBP may be designed to allow the cutout patterns CP of the second display area DA2 to easily expand and contract. Therefore, in such an embodiment, the strain applied to the second display area DA2 may be effectively reduced due to the double curvature.

The second pixels PX2, a second dams DAM2, and a power contact hole PCT may be disposed in each of the cutout patterns CP. A first dam DAM1 may be disposed at an edge of the third display area DA3 adjacent to the second display area DA2.

The second pixels PX2 may be arranged substantially in a predetermined direction DRA or a length direction of the cutout patterns CP. In an embodiment, each of the second pixels PX2 may include a plurality of emission areas EA1', EA2', and EA3'. The number of the emission areas EA1', EA2' and EA3' of each of the second pixels PX2 may be different from the number of the emission areas EA1, EA2, EA3 and EA4 of each of the first pixels PX1. In an alternative embodiment, the number of the emission areas EA1', EA2' and EA3' of each of the second pixels PX2 may be equal to, but is not limited to being, the number of the emission areas EA1", EA2" EA3" of each of the first pixels PX1. In an embodiment, the number of the emission areas EA1', EA2' and EA3' of each of the second pixels PX2 may be different from the number of the emission areas EA1", EA2" and EA3" each of the third pixels PX3.

In one embodiment, for example, each of the third pixels PX3 may include a first emission area EA1', a second emission area EA2', and a third emission area EA3'. The first emission area EA1' refers to the emission area of the first sub-pixel that emits first light, the second emission area EA2' refers to the emission area of the second sub-pixel that emits second light, and the third emission area EA3' refers to the emission area of the third sub-pixel that emits third light.

The first emission area EA1', the second emission area EA2' and the third emission area EA3' may emit lights of different colors from each other. In one embodiment, for example, the first emission area EA1' may emit light of red color, the second emission area EA2' may emit light of green color, and the third emission area EA3' may emit light of blue color.

Figure 11:
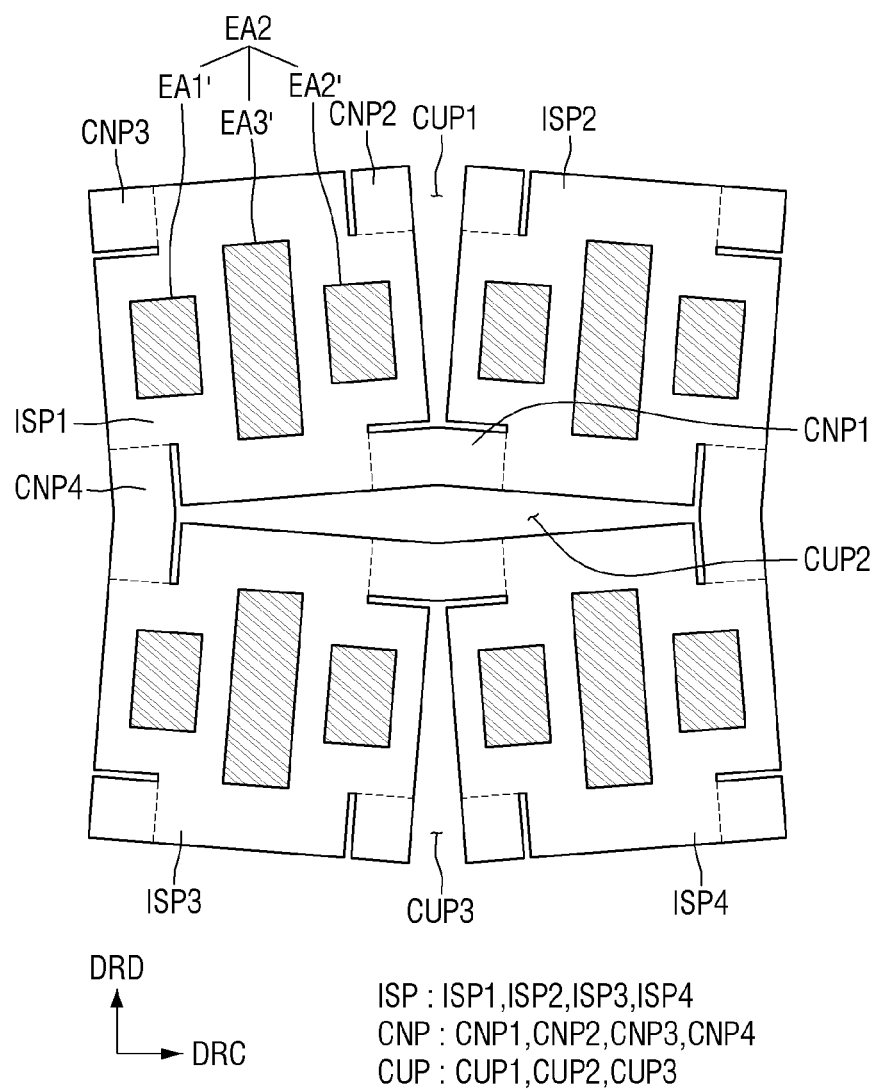

The first emission area EA1', the second emission area EA2' and the third emission area EA3' may be arranged in the predetermined direction DRA. Each of the first emission area EA1', the second emission area EA2' and the third emission area EA3' may have a rectangular shape when viewed from the top. In one embodiment, for example, each of the first emission area EA1', the second emission area EA2' and the third emission area EA3' may have a rectangular shape having shorter sides in the predetermined direction DRA and longer sides in a direction DRB crossing the predetermined direction DRA, when viewed from the top, but not being limited thereto. Alternatively, each of the first emission areas EA1', the second emission areas EA2' and the third emission areas EA3' may have another polygonal shape than a quadrangular shape, a circular shape or an elliptical shape when viewed from the top. In an embodiment, the first emission area EA1', the second emission area EA2' and the third emission area EA3' have substantially a same area as each other as shown in FIG. 11, but the disclosure is not limited thereto. Alternatively, at least one of the first emission area EA1', the second emission area EA2' and the third emission area EA3' may have a different area than the others.

The second dam DAM2 may be disposed to surround the second pixels PX2. The second dam DAM2 may be disposed at the edges of each of the cutout patterns CP.

The power contact hole PCT may be disposed in the area surrounded by the second dam DAM2. In an embodiment, the power contact hole PCT may be disposed between the second dam DAM2 and the second pixel PX2 disposed at one edge of the cutout pattern CP as shown in FIG. 8, but the disclosure is not limited thereto. The power contact hole PCT may be a power connector to which a first supply voltage line VSL (see FIG. 7) and a second common electrode 273 (see FIG. 12) are connected. Accordingly, the first supply voltage of the first supply voltage line VSL (see FIG. 7) may be applied to the second common electrode 273 (see FIG. 12).

In an embodiment, as shown in FIG. 8, where the second display area DA2 includes the cutout patterns CP, the cutout connection patterns CBP, and the cutting grooves CG, the cutout patterns CP may expand and contract. Therefore, the strain applied to the second display area DA2 due to the double curvature of the first corner portion CS1 can be reduced.

Figure 9:
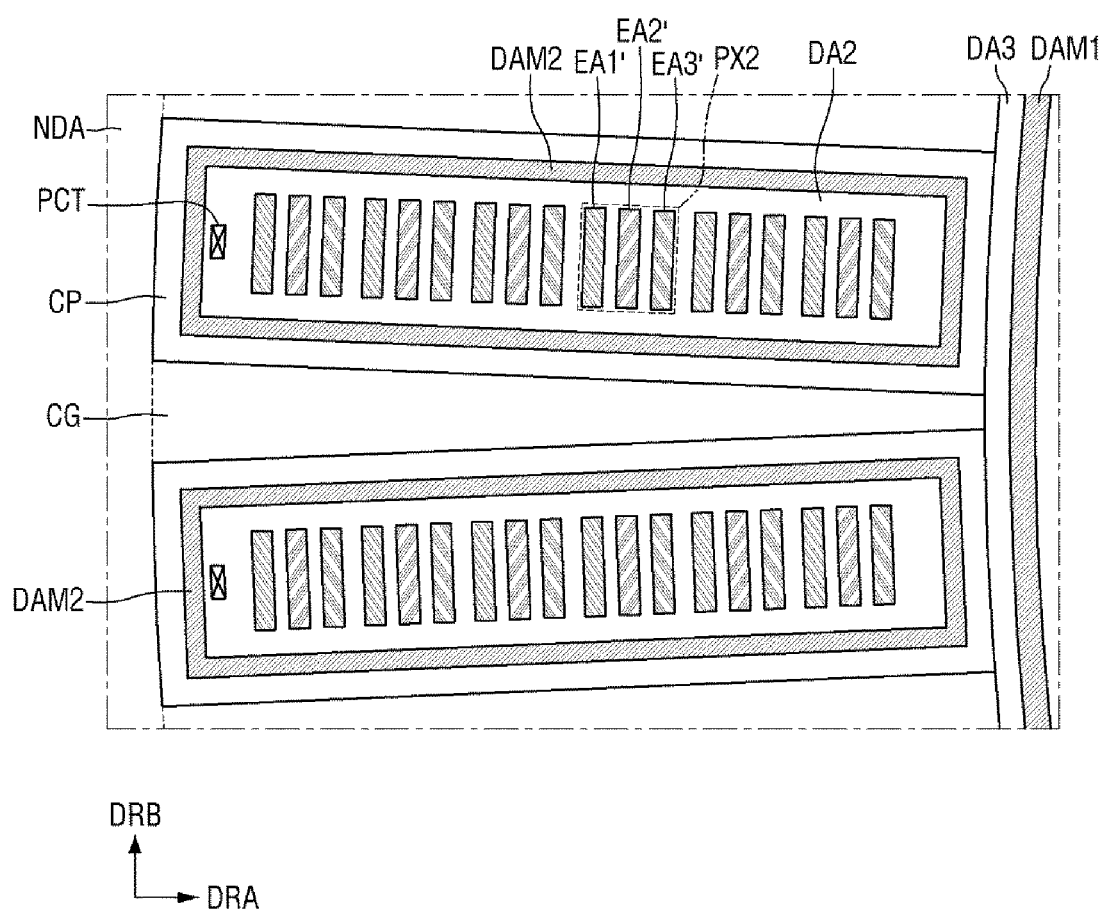
FIG. 9 is a plan view showing an alternative embodiment of the second display area of FIG. 5.

FIG. 9 is a plan view showing an alternative embodiment of the second display area of FIG. 5.

The second display area shown in FIG. 9 is substantially the same as the second display area of FIG. 8 except that the cutout connection patterns CBP are eliminated and thus the cutout patterns CP are connected directly to the non-display area NDA, and that the area of each of the cutout patterns CP increases so that more second pixels PX2 may be disposed in the cutout patterns CP. The same or like elements shown in FIG. 9 have been labeled with the same reference characters as used above to describe the embodiment of the second display area shown in FIG. 8, and any repetitive detailed description thereof will hereinafter be omitted.

Figure 10:
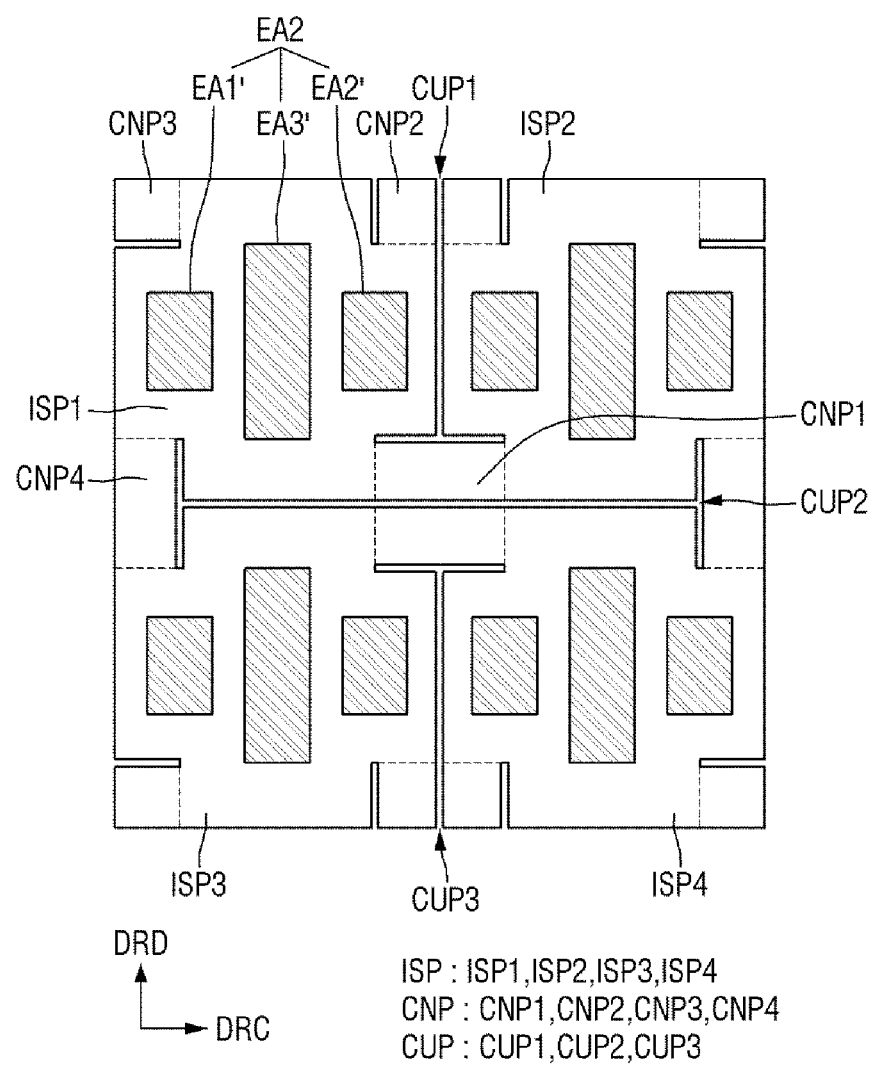
FIGS. 10 and 11 are plan views showing another alternative embodiment of the second display area of FIG. 5.

FIGS. 10 and 11 are plan views showing another alternative embodiments of the second display area of FIG. 5.

Referring to FIGS. 10 and 11, the second display area DA2 includes island patterns ISP, connection patterns CNP, and cutting parts CUP. The island patterns ISP may include first to fourth island patterns ISP1, ISP2, ISP3, and ISP4. The connection patterns CNP may include first to fourth connection patterns CNP1, CNP2, CNP3, and CNP4. The cutting parts CUP may include first to third cutting parts CUP1, CUP2, and CUP3.

The first to fourth island patterns ISP1, ISP2, ISP3 and ISP4 may be spaced apart from one another. In one embodiment, for example, the first cutout CUP1 is defined between the first island pattern ISP1 and the second island pattern ISP2, such that the first island pattern ISP1 may be spaced apart from the second island pattern ISP2 in a predetermined direction DRC. In such an embodiment, the second cutting part CUP2 is defined between the first island pattern ISP1 and the third island pattern ISP3, such that the third island pattern ISP3 may be spaced apart from the first island pattern ISP1 in a direction DRD crossing the predetermined direction DRC. In such an embodiment, the second cutting part CUP2 is defined between the second island pattern ISP2 and the fourth island pattern ISP4, such that the fourth island pattern ISP4 may be spaced apart from the second island pattern ISP2 in the direction DRD crossing the predetermined direction DRC. In such an embodiment, the third cutting part CUP3 is defined between the third island pattern ISP3 and the fourth island pattern ISP4, such that the fourth island pattern ISP4 may be spaced apart from the third island pattern ISP3 in the predetermined direction DRC.

The first to fourth connection patterns CNP1, CNP2, CNP3 and CNP4 may extend from each of the first to fourth island patterns ISP1, ISP2, ISP3, and ISP4. The first to fourth island patterns ISP1, ISP2, ISP3, and ISP4 may have a substantially same structure as each other. Hereinafter, for convenience of description, the first island pattern ISP1 will be described in detail, and any repetitive detailed description of the second to fourth island patterns, ISP2, ISP3, and ISP4 may be omitted.

The first connection pattern CNP1 may extend along the predetermined direction DRC from the first island pattern ISP1. The first connection pattern CNP1 may connect the first island pattern ISP1 with the second island pattern ISP2.

The second connection pattern CNP2 may extend along the direction DRD crossing the predetermined direction DRC from the first island pattern ISP1. The second connection pattern CNP2 may be connected to the island pattern disposed on the upper side of the first island pattern ISP1.

The third connection pattern CNP3 may extend along the predetermined direction DRC from the first island pattern ISP1. The third connection pattern CNP3 may be connected to the island pattern disposed on the left side of the first island pattern ISP1.

The fourth connection pattern CNP4 may extend along the direction DRD crossing the predetermined direction DRC from the first island pattern ISP1. The fourth connection pattern CNP4 may be connected to the third island pattern ISP3.

The second pixel PX2 may be disposed in each of the first to fourth island patterns ISP1, ISP2, ISP3 and ISP4. The second pixel PX2 may include a first emission area EA1' that emits light of a first color, a second emission area EA2' that emits light of a second color, and a third emission area EA3' that emits light of a third color of light. In one embodiment, for example, the first color may be red, the second color may be green, and the third color may be blue.

The first emission area EA1', the second emission area EA2' and the third emission area EA3' may be arranged in the predetermined direction DRC. The third emission area EA3' may be disposed between the first emission area EA1' and the second emission area EA2' in the predetermined direction DRC. Each of the first emission area EA1', the second emission area EA2' and the third emission area EA3' may have a rectangular shape when viewed from the top. In one embodiment, for example, each of the first emission area EA1', the second emission area EA2' and the third emission area EA3' may have a rectangular shape having shorter sides in the predetermined direction DRC and longer sides in the direction DRD crossing the predetermined direction DRC when viewed from the top, but the disclosure is not limited thereto. Alternatively, each of the first emission areas EA1', the second emission areas EA2' and the third emission areas EA3' may have another polygonal shape than a quadrangular shape, a circular shape or an elliptical shape when viewed from the top. In an embodiment, the area of the third emission areas EA3' is the larger than the area of the first emission area EA1' and the area of the second emission area EA2' as shown in FIGS. 10 and 11, but the disclosure is not limited thereto.

In an embodiment, when the strain is applied to the second display area DA2 due to the double curvature of the first corner CS1, the distance between the first to fourth island patterns ISP1, ISP2, ISP3 and ISP4 may be widened, as shown in FIG. 11. In such embodiment, the first cutting parts CUP1, the second cutting parts CUP2 and the third cutting parts CUP3 may be widened without changing the shapes of the island patterns ISP and the connection patterns CNP such that the strain applied to the second display area DA2 may be effectively reduced due to the maintained shapes of the island patterns ISP and the connection patterns CNP.

Figure 12:
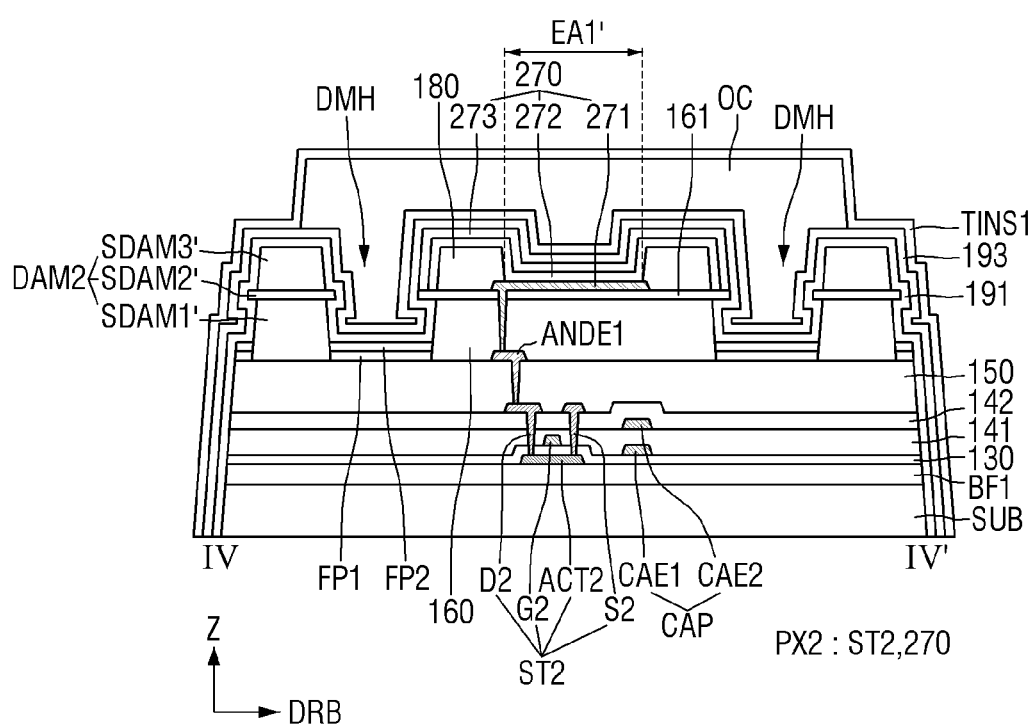
FIG. 12 is a cross-sectional view showing an embodiment of the display panel taken along line III-III' of FIG. 8.

FIG. 12 is a cross-sectional view showing an embodiment of the display panel taken along line III-III' of FIG. 8.

In an embodiment, a second thin-film transistor ST2 of the thin-film transistor layer TFTL, the second pixel electrode 271 of the second light-emitting element 270, the second emissive layer 272 and the second common electrode 273 of FIG. 12 may be substantially to the same as the first thin-film transistor ST1 of the thin-film transistor layer TFTL, the first pixel electrode 171 of the first light-emitting element 170, the first emissive layer 172 and the first common electrode 173 described above with reference to FIG. 8, and any repetitive detailed description thereof will be omitted for convenience of description. In such an embodiment, the first emission area EA1' and the third emission area EA3' shown in FIG. 12 substantially the same as the second emission area EA2'.

The second display area DA2 includes cutout patterns CP and cutting grooves CG formed by cutting the display panel 300 with a laser. In such an embodiment, the organic encapsulation layer 192 of the first display area DA1 and the third display area DA3 is formed via an inkjet process. However, the spot placement accuracy of the inkjet process is typically not high. Accordingly, if the length of the cutout patterns CP in the predetermined direction DRB is several tens of micrometers (μm), it may be difficult to accurately place the organic encapsulation layer 192 within the second dams DAM2 of the cutout patterns CP. If the organic encapsulation layer 192 is formed in the cutting grooves CG, the cutout patterns CP may be connected by the organic encapsulation layer 192, such that the strain applied to the second display area DA2 may not be effectively reduced by the double curvature. Accordingly, in an embodiment of the invention, the thin-film encapsulation layer TFEL in the first display area DA1 and the third display area DA3 includes the first inorganic encapsulation layer 191, the organic encapsulation layer 192 and the second inorganic encapsulation layer 193, whereas the thin-film encapsulation layer TFEL in the second display area DA2 includes the first inorganic encapsulation layer 191 and the second inorganic encapsulation layer 193 not including the organic encapsulation layer 192.

In such an embodiment, since the organic encapsulation layer 192 of the thin-film encapsulation layer TFEL in the first display area DA1 and the third display area DA3 is higher than the first inorganic encapsulation layer 191 and the second inorganic encapsulation layer 193, the organic encapsulation layer 192 may function as a particle cover layer to cover particles. In an embodiment where the thin-film encapsulation layer TFEL does not include the organic encapsulation layer 192 in the second display area DA2, a part of the first inorganic encapsulation layer 191 and the second inorganic encapsulation layer 193 may be broken by particles. As a result, moisture or oxygen may be introduced and thus the emissive layer 172' may be damaged, such that the second pixels PX2 disposed on the cutout patterns CP may be displayed as dark spots.

In such an embodiment, an overcoat layer OC, which may be formed via a photolithography process, is disposed on the second inorganic encapsulation layer 193 in the second display area DA2, and the first touch inorganic layer TINS1 is disposed on the overcoat layer OC. In such an embodiment, where the length of the cutout pattern CP in the predetermined direction DRB is several tens of μm, since the process error of the organic layer formed via the photolithography process is only several μm, the overcoat layer OC may be accurately provided within the second dam DAM2.

While the organic encapsulation layer 192 is formed via an inkjet process, the overcoat layer OC is formed via a photolithography process, and thus the organic encapsulation layer 192 and the overcoat layer OC may include or be made of different materials from each other.

Since the first inorganic encapsulation layer 191 and the second inorganic encapsulation layer 193 are disposed on the second dam DAM2, the first touch inorganic layer TINS1 and the second inorganic encapsulation layer 193 may be in contact with each other on the second dam DAM2. Therefore, the second light-emitting elements 270 of the second pixels PX2 may be encapsulated by the second inorganic encapsulation layer 193 and the first touch inorganic layer TINS1. In such an embodiment, since the overcoat layer OC has a height higher than that of the second inorganic encapsulation layer 193 and the first touch inorganic layer TIS1, the overcoat layer OC may serve as a particle cover layer covering particles.

The second dam DAM2 may include a first sub-dam SDAM1' including or made of a same material as the second planarization layer 160, a second sub-dam SDAM2' including or made of a same material as the barrier layer 161, and a third sub-dam SDAM3' including or made of a same material as the bank 180. The second dam DAM2 may further include a fourth sub-dam disposed on the third sub-dam SDAM3'.

A dam hole DMH may be defined at the inner side of the second dam DAM2. In an embodiment where the second emissive layer 272 is formed using a same mask as the second common electrode 273 in the second display area DA2, a feature for disconnecting the second emissive layer 272, such as the dam hole DMH is desired.

The dam hole DMH may be formed into an undercut shape. The undercut shape refers to a hole in which the inlet is smaller than the bottom or a hole in which the inlet is smaller than the area between the inlet and the bottom. A hole in the undercut shape may resemble a pot or eaves of a roof. In one embodiment, for example, the entrance of the dam hole DMH may be defined by the barrier layer 161. The lower surface of the barrier layer 161 of the second planarization layer 160 may not be covered by the second planarization layer 160. Accordingly, the size of the inlet of the dam hole DMH may be smaller than the size of the area between the inlet and the bottom of the dam hole DMH.

In the dam hole DMH, a first floating pattern FP1, a second floating pattern FP2, a first inorganic encapsulation layer 191, and a second inorganic encapsulation layer 193 are disposed. The dam hole DMH may be filled with the overcoat layer OC. In such an embodiment, the second emissive layer 272 and the second common electrode 273 may have poor step coverage. Therefore, in such an embodiment where the dam hole DMH is formed into the undercut shape, the second emissive layer 272 and the second common electrode 273 may not be disposed on the sidewalls of the dam hole DMH. Accordingly, the second emissive layer 272 and the second common electrode 273 may be disconnected at the dam hole DMH. The step coverage refers to the ability of subsequent layers to evenly cover levels ("steps") already present on the substrate without being disconnected.

The first floating pattern FP1 may be disposed on the second planarization layer 160 in the dam hole DMH. The first floating pattern FP1 may be a residual layer of the second emissive layer 272 that is not connected to the second emissive layer 272 but is disconnected from it. The first floating pattern FP1 may include or be made of a same material as the second emissive layer 272. In an embodiment where the size of the dam hole DMH is small, the first floating pattern FP1 may not exist.

In an embodiment, the second floating pattern FP2 may be disposed on the first floating pattern FP1 in the dam hole DMH. The second floating pattern FP2 may be a residual layer of the second common electrode 273 that is not connected to but disconnected from the second common electrode 273. The second floating pattern FP2 may include or be made of a same material as the second common electrode 273. In an embodiment where the size of the dam hole DMH is small, the second floating pattern FP2 may be disposed.

In an embodiment, the first inorganic encapsulation layer 191, the second inorganic encapsulation layer 193 and the first touch inorganic layer TINS1 may be disposed on the cut surface or side surfaces of the cutout pattern CP. In one embodiment, for example, the first inorganic encapsulation layer 191, the second inorganic encapsulation layer 193 and the first touch inorganic layer TINS1 may be disposed on the cut surfaces or side surfaces of the substrate SUB, the first buffer layer BF1, the gate insulator 130, the first interlayer dielectric layer 141, the second interlayer dielectric layer 142 and the first planarization layer 150 of the cutout pattern CP. Accordingly, damage to the second emissive layer 272 which may occur when moisture or oxygen is introduced through the cut surface or side surfaces of the cutout pattern CP may be effectively prevented.

In an embodiment, as shown in FIG. 12, when the organic encapsulation layer 192 is formed via an inkjet process, it is difficult to form the organic encapsulation layer 192 on the second pixels PX2 of the cutout pattern CP because the area of the cutout pattern CP is small. If the organic encapsulation layer 192 is formed not on the cutout pattern PC but in the cutting groove CG due to a process error, for example, the cutout patterns CP are connected by the organic encapsulation layer 192, such that the strain applied to the second display area DA2 may not be effectively reduced by the double curvature. Therefore, in an embodiment, the organic encapsulation layer 192 is not formed in the second display area DA2, and the overcoat layer OC formed via the photolithography process is formed on the second inorganic encapsulation layer 193 as a particle cover layer. In such an embodiment, by forming the first touch inorganic layer TINS1 on the overcoat layer OC and bringing the first touch inorganic layer TINS1 into contact with the second inorganic encapsulation layer 193 on the second dam DAM2, such that the second light-emitting elements 370 of the second pixels PX2 may be effectively encapsulated.

Figure 13:
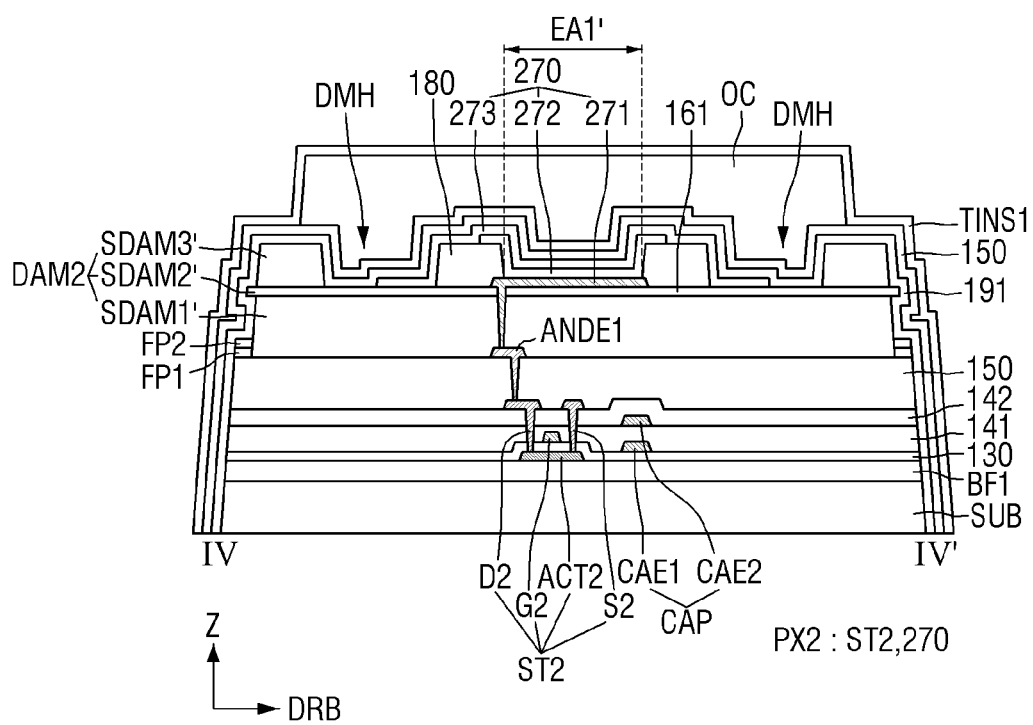
FIG. 13 is a cross-sectional view showing an alternative embodiment of the display panel taken along line III-III' of FIG. 8.

FIG. 13 is a cross-sectional view showing an alternative embodiment of the display panel taken along line III-III' of FIG. 8.

The embodiment of FIG. 13 is substantially the same as the embodiment of FIG. 12 except that the dam hole DMH is omitted. The same or like elements shown in FIG. 13 have been labeled with the same reference characters as used above to describe the embodiment of the display panel shown in FIG. 12 and any repetitive detailed description thereof will hereinafter be omitted.

Referring to FIG. 13, in an embodiment, the second emissive layer 272 may be formed to be accurately aligned with the emission areas EA1', EA2' and EA3' using a fine metal mask, such that any feature for disconnecting the second emissive layer 272 may be omitted. Therefore, in such an embodiment, the dam hole DMH may be omitted.

The second emissive layer 272 may be disposed on the second pixel electrode 271 and on the side surface and a part of the top surface of the bank 180. The width of the second common electrode 273 in the direction DRB crossing the predetermined direction DRA may be larger than the width of the second emissive layer 272 in the direction DRB crossing the predetermined direction DRA.

Figure 14:
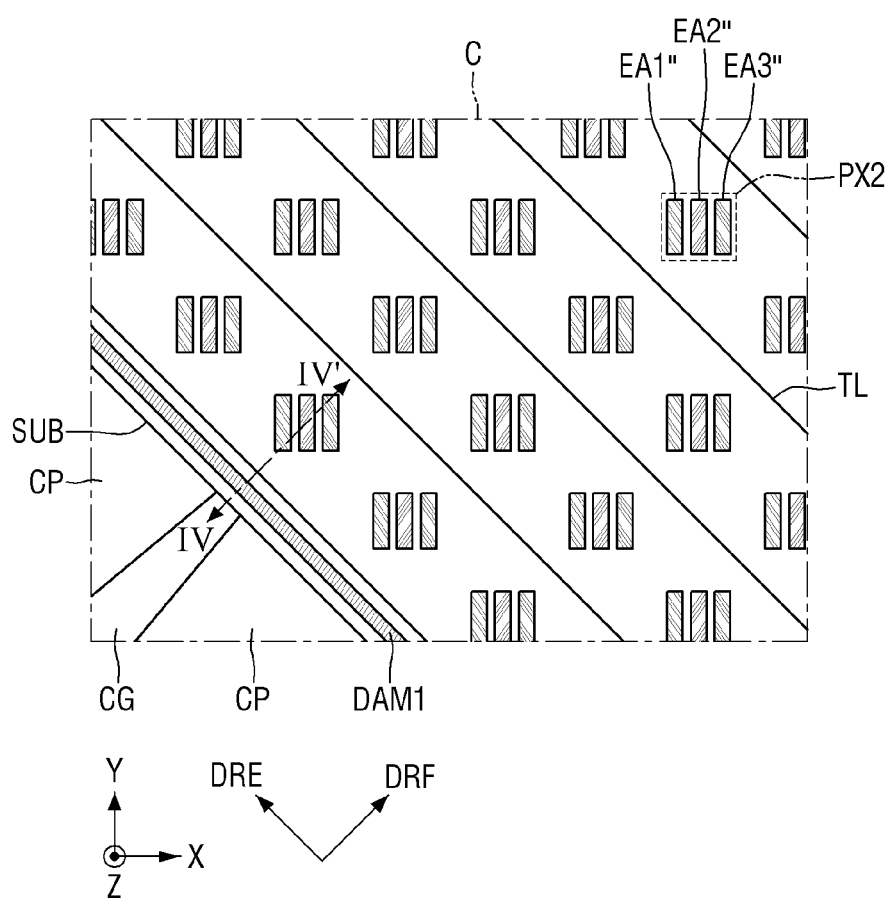
FIG. 14 is a plan view showing an embodiment of the third display area of FIG. 5.

FIG. 14 is a plan view showing an embodiment of the third display area of FIG. 5. FIG. 14 is an enlarged view of the area C in FIG. 5.

Referring to FIG. 14, touch driving lines TL may extend in a predetermined direction DRE. The predetermined direction DRE may be inclined by about 135 degrees from the first direction (X-axis direction) and by about 45 degrees from the second direction (Y-axis direction). The touch driving lines TL may be arranged in a direction DRF crossing the predetermined direction DRE. The direction DRF crossing the predetermined direction DRE may be inclined by about 45 degrees from the first direction (X-axis direction) and by about 45 degrees from the second direction (Y-axis direction).

Third pixels PX3 may be disposed between the touch driving lines TL adjacent to each other. The third pixels PX3 disposed between the touch driving lines TL adjacent to each other may be arranged in the predetermined direction DRE. At least one touch driving line TL may be disposed between the second emission areas EA1' adjacent to each other in the direction DRF crossing the predetermined direction DRE. The spacing distance between the touch driving lines TL in the direction DRF crossing the predetermined direction DRE and the spacing distance between the third pixels PX3 in the direction DRF crossing the predetermined direction DRE may be approximately several tens of μm.

Each of the third pixels PX3 may include a plurality of emission areas EA1", EA2", and EA3". The number of the emission areas EA1", EA2" and EA3" of each of the third pixels PX3 may be different from the number of the emission areas EA1, EA2, EA3 and EA4 of each of the first pixels PX1.

In one embodiment, for example, each of the third pixels PX3 may include a first emission area EA1", a second emission area EA2", and a third emission area EA3". The first emission area EA1" refers to the emission area of the first sub-pixel emitting first light, the second emission area EA2" refers to the emission area of the second sub-pixel emitting second light, and the third emission area EA3" refers to the emission area of the third sub-pixel that emits third light.

The first emission area EA1", the second emission area EA2" and the third emission area EA3" may emit lights of different colors. In one embodiment, for example, the first emission area EA1" may emit light of red color, the second emission area EA2" may emit light of green color, and the third emission area EA3" may emit light of blue color.

The first emission area EA1", the second emission area EA2" and the third emission area EA3" may be arranged in the first direction (X-axis direction). Alternatively, the first emission area EA1", the second emission area EA2" and the third emission area EA3" may be arranged in the direction DRF crossing the predetermined direction DRE.

The shape of each of the emission areas EA1", EA2" and EA3" of the third pixels PX3 may be different from the shape of each of the emission areas EA1, EA2, EA3 and EA4 of the first pixels PX1 when viewed from the top. In one embodiment, for example, each of the first emission area EA1", the second emission area EA2" and the third emission area EA3" may have a rectangular shape when viewed from the top. Each of the first emission area EA1", the second emission area EA2" and the third emission area EA3" may have a rectangular shape having shorter sides in the first direction (X-axis direction) and longer sides in the second direction (Y-axis direction) when viewed from the top.

However, the shape of each of the first emission areas EA1", the second emission areas EA2" and the third emission areas EA3" when viewed from the top is not limited to those described above. Alternatively, each of the first emission areas EA1", the second emission areas EA2" and the third emission areas EA3" may have another polygonal shape than a quadrangular shape, a circular shape or an elliptical shape when viewed from the top. In an embodiment, the first emission area EA1", the second emission area EA2" and the third emission area EA3" may have substantially a same area as each other as shown in FIG. 14, but the disclosure is not limited thereto. Alternatively, at least one of the first emission area EA1", the second emission area EA2" and the third emission area EA3" may have a different area than the others.

A first dam DAM1 may be disposed at an edge of the third display area DA3 adjacent to the second display area DA2. The first dam DAM1 may be disposed between the touch driving line TL and the cutout pattern CP of the second display area DA2. The first dam DAM1 may be a feature for preventing overflow of the organic encapsulation layer 192 (see FIG. 15) of the encapsulation layer TFEL. The first dam DAM1 may extend in the predetermined direction DRE.

In an embodiment, as shown in FIG. 14, a third display area DA3 including third pixels PX3 displaying images is disposed between the first display area DA1 and the second display area DA2, such that a user may not recognize a gap between the image displayed on the first display area DA1 and the image displayed on the second display area DA2.

Figure 15:
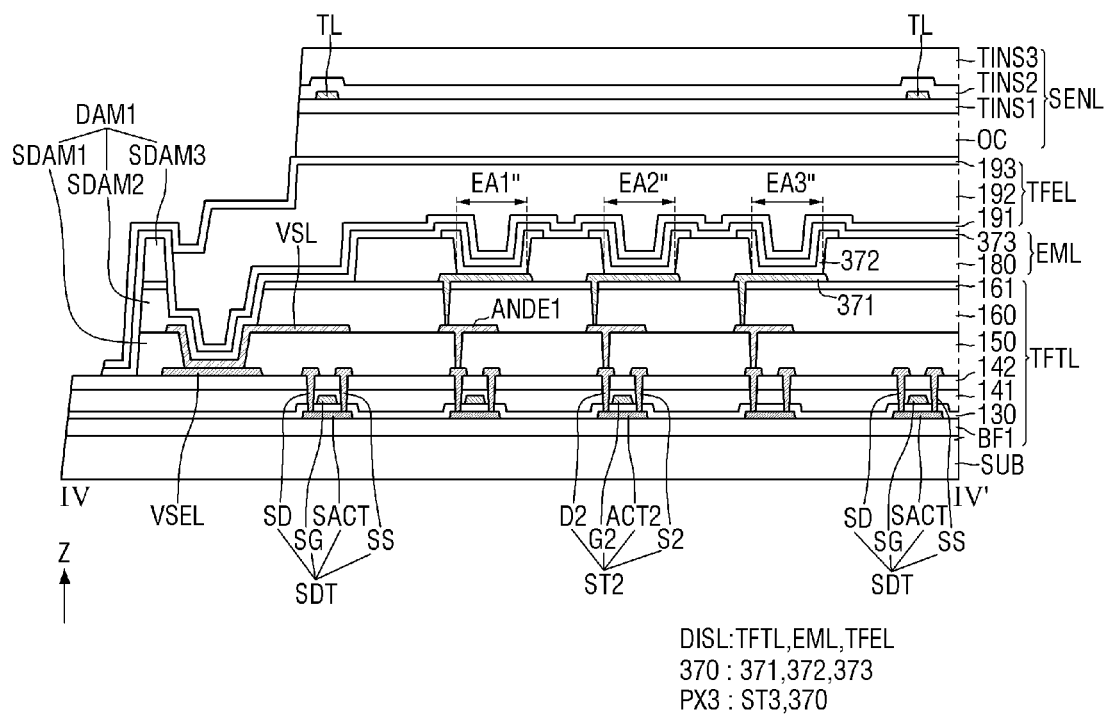
FIG. 15 is a cross-sectional view showing an embodiment of a display panel, taken along line IV-IV' of FIG. 14.

FIG. 15 is a cross-sectional view showing an embodiment of a display panel, taken along line IV-IV' of FIG. 14.

A second thin-film transistor ST2 of the thin-film transistor layer TFTL, a third pixel electrode 371 of the third light-emitting element 370, a third emissive layer 372 and a third common electrode 373 of FIG. 15 may be substantially the same as the first thin-film transistor ST1 of the thin-film transistor layer TFTL, the first pixel electrode 171 of the first light-emitting element 170, the first emissive layer 172 and the first common electrode 173 described above with reference to FIG. 8; and, therefore, any repetitive detailed description thereof will be omitted.

The third display area DA3 may include third pixels PX3 and touch driving lines TL. The touch driving lines TL may be connected to the driving electrodes TE (see FIG. 7). The third display area DA3 may include not only the touch driving lines TL but also touch sensing lines connected to the sensing electrodes RE (see FIG. 7).

In an embodiment, the touch driving lines TL do not overlap with the first emission area EA1", the second emission area EA2" or the third emission area EA3" to prevent the luminance of the light from being reduced due to blocking the light emitted from the emission areas EA1", EA2" and EA3" of the third display area DA3 by the touch driving lines TL. The touch driving lines TL may be disposed on the first touch inorganic layer TINS1. The touch driving lines TL may include or be made of a same material as the connection electrodes BE of FIG. 7, and may be disposed in a same layer as the connection electrodes BE of FIG. 7.

A scan driving transistor SDT of a scan driver circuit SDC may include a scan active layer SACT, a scan gate electrode SG, a scan source electrode SS and a scan drain electrode SD. The scan active layer SACT, the scan gate electrode SG, the scan source electrode SS and the scan drain electrode SD of the scan driving transistor SDT may be substantially the same as the first active layer ACT1, the first gate electrode G1, the first source electrode S1 and the first drain electrode D1 of the first thin-film transistor ST1; and, therefore, any repetitive detailed description thereof will be omitted.

The scan driving transistor SDT is disposed in the thin-film transistor layer TFTL together with the second thin-film transistors ST2 for driving the first emission area EA1", the second emission area EA2" and the third emission area EA3" of the third pixels PX3. Therefore, the scan driving transistor SDT may be disposed in a position where the second thin film transistors ST2 are not disposed not to overlap the second thin film transistors ST2. Since the touch driving lines TL are disposed not to overlap the first emission area EA1", the second emission area EAT' and the third emission area EA3", the scan driving transistor SDT may overlap with the touch driving line TL in the third direction (Z-axis direction).

A first voltage connection line VSEL may be disposed on the second interlayer dielectric layer 142. The first voltage connection line VSEL may include or be made of a same material as the first source electrode S1 and the first drain electrode D1 of the first thin film transistor ST1, the second source electrode S2 and the second drain electrode D2 of the second thin film transistor ST2, and the source electrode SS and the drain electrode SD of the scan driving transistor SDT.

A first voltage line VSL may be disposed on the first planarization layer 150. The first voltage line VSL may include or be formed of a same material as a first connection electrode ANDE1. The first voltage line VSL may be connected to the first voltage connection line VSEL through a contact hole defined through the first planarization layer 150. A first supply voltage may be applied to the first voltage line VSL.

The third common electrode 373 may be connected to the first voltage line VSL through a contact hole defined through the second planarization layer 160. The first supply voltage of the first voltage line VSL may be applied to the third common electrode 373.

The first dam DAM1 may be disposed in the third display area DA3 to prevent the organic encapsulation layer 192 of the thin-film encapsulation layer from overflowing. The first dam DAM1 may include a first sub-dam SDAM1 made of the same material as the first planarization layer 150, a second sub-dam SDAM2 made of the same material as the second planarization layer 160, and a third sub-dam SDAM3 made of the same material as the bank 180. Due to the first dam DAM1, the end of the organic encapsulation layer 192 may be disposed between the outermost first emission area EA1" and the dam DAM. The first inorganic encapsulation layer 191 and the second inorganic encapsulation layer 193 may be disposed on the first dam DAM1. The first inorganic encapsulation layer 191 and the second inorganic encapsulation layer 193 may be in contact with each other on the first dam DAM1.

Another dam for confining the organic encapsulation layer 192 which flows over the first dam DAM1 may be disposed on the outer side of the first dam DAM1. The another dam may have substantially the same structure as the first dam DAM1. Alternatively, the another dam may include at least one of the first sub-dam SDAM1, the second sub-dam SDAM2 and the third sub-dam SDAM3 of the first dam DAM1.

In an embodiment, as shown in FIG. 15, the scan driving transistors SDTs of the scan driver circuit SDC may be disposed at positions, where the second thin-film transistors ST2 are not disposed, not to overlap the second thin-film transistors ST2 for driving the first emission area EA1", the second emission area EA2" and the third emission area EA3" of the third pixel PX3. In such an embodiment, since the touch driving lines TL are disposed not to overlap the first emission area EA1", the second emission area EA2" and the third emission area EA3", the scan driving transistor SDT may overlap the touch driving line TL in the direction (Z-axis direction).

Figure 16:
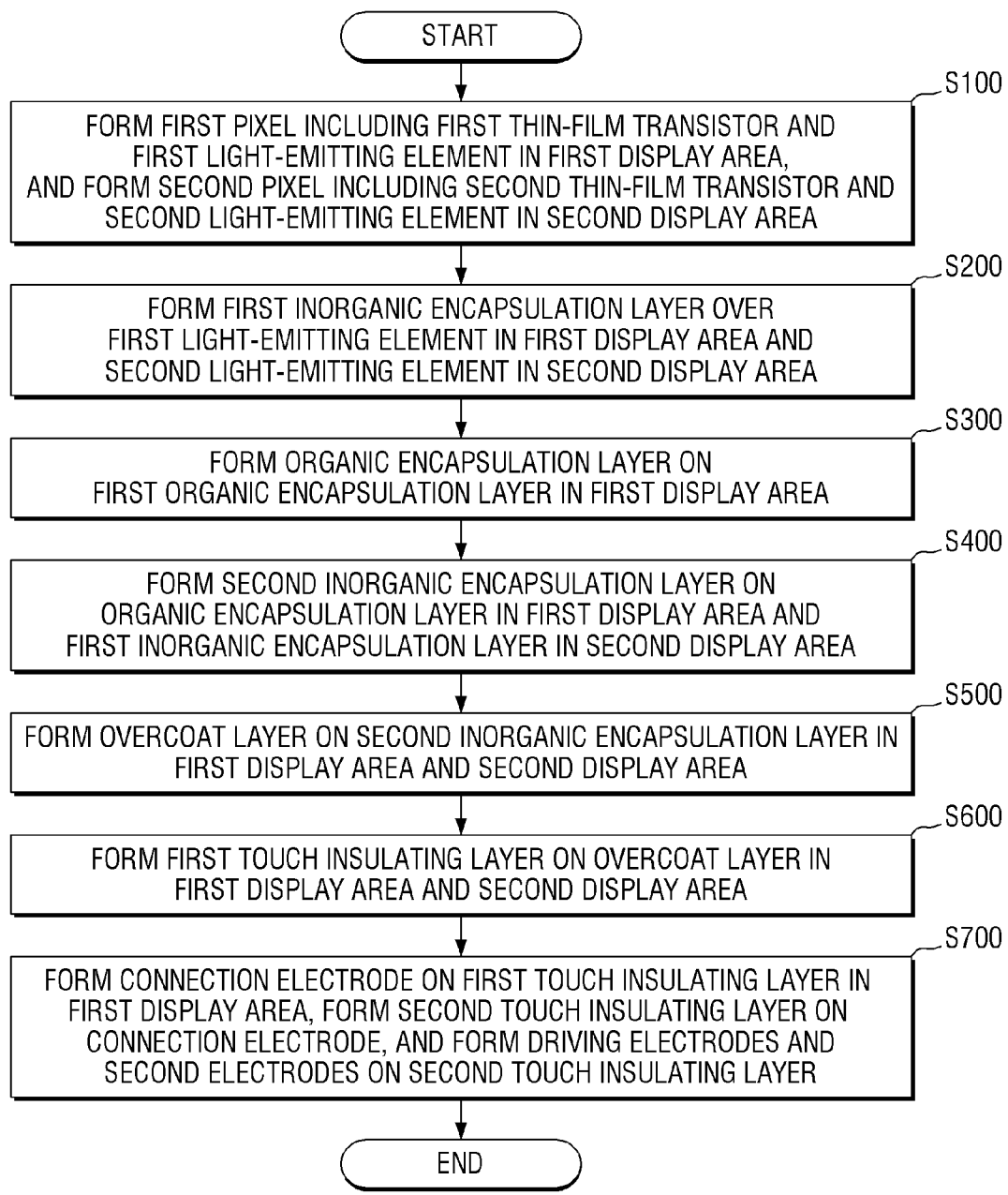
FIG. 16 is a flowchart for illustrating a method of fabricating a display device according to an embodiment of the disclosure.

FIG. 16 is a flowchart for illustrating a method of fabricating a display device according to an embodiment of the disclosure. FIGS. 17 to 30 are cross-sectional views for illustrating the method of fabricating a display device according to an embodiment of the disclosure.

FIGS. 17, 19, 21, 22, 24, 26, 28 and 30 are cross-sectional views showing an embodiment of the display panel, taken along line II-II' of FIG. 6. FIGS. 18, 20, 23, 25, 27 and 29 are cross-sectional views showing an embodiment of the display panel, taken along line III-III' of FIG. 8. FIGS. 17, 19, 21, 22, 24, 26, 28 and 30 show the first display area DA1 of the display panel 300. FIGS. 18, 20, 23, 25, 27 and 29 show the second display area DA2 of the display panel 300.

Figure 17:
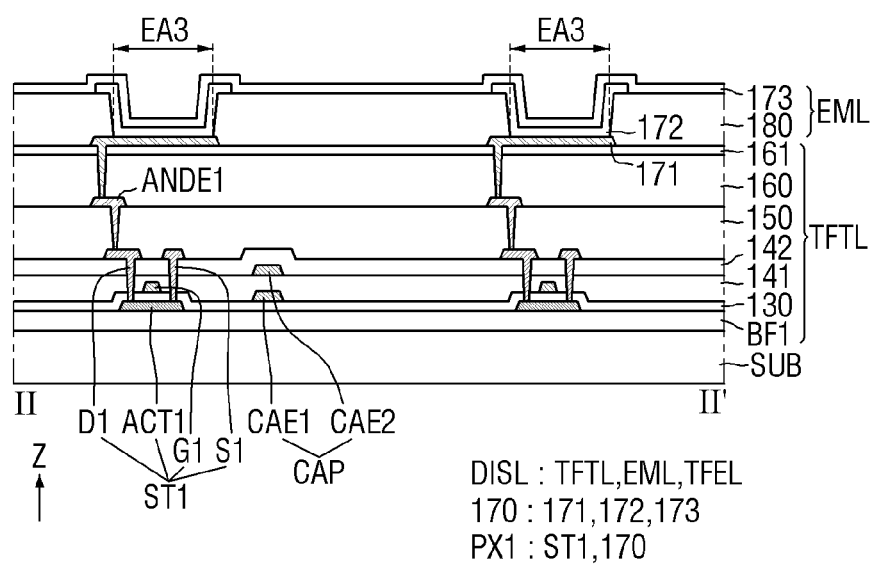
FIGS. 17 to 30 are cross-sectional views for illustrating the method of fabricating a display device according to an embodiment of the disclosure.
Figure 18:
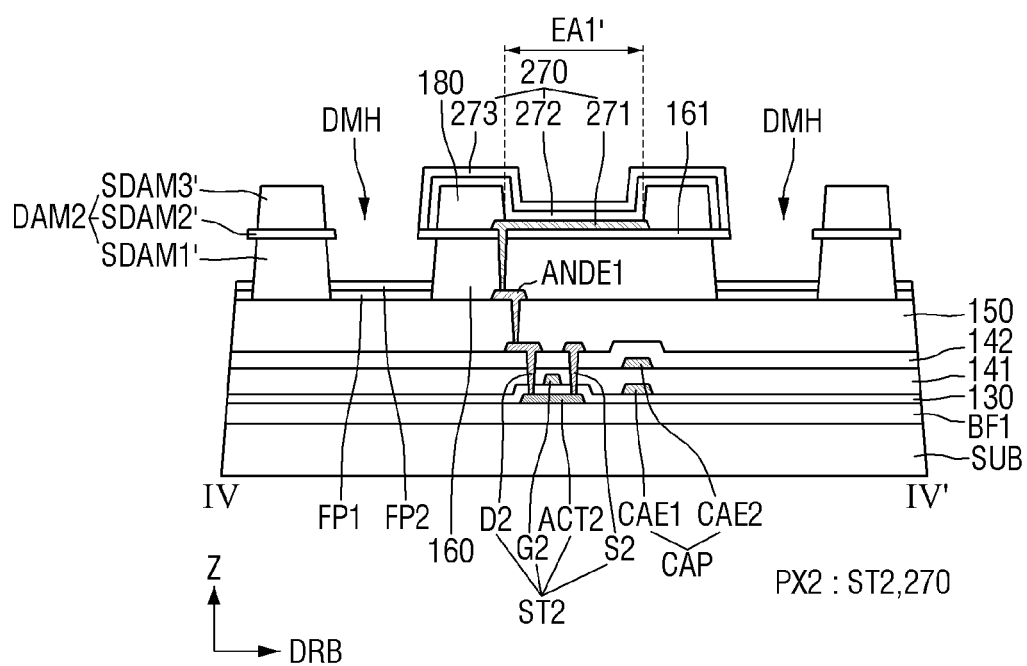

In an embodiment, as shown in FIGS. 16, 17 and 18, a first pixel PX1 including a first thin-film transistor ST1 and a first light-emitting element 170 is provided or formed in the first display area DA1, and a second pixel PX2 including a second thin-film transistor ST2 and a second light-emitting element 270 is provided or formed in the second display area DA2 (S100 of FIG. 16).

The first thin-film transistor ST1 and the second thin-film transistor ST2 are provided or formed on a substrate SUB. The first thin-film transistor ST1 may include a first active layer ACT1, a first source electrode S1, a first drain electrode D1 and a first gate electrode G1. The plurality of inorganic insulating layers may include a first buffer layer BF1, a gate insulator 130, a first interlayer dielectric layer 141, and a second interlayer dielectric layer 142.

The first active layer ACT1 of the first thin-film transistor ST1 and the second active layer ACT2 of the second thin-film transistor ST2 are simultaneously formed on the first buffer layer BF1 by using a photolithography process.

An inorganic material is deposited on the first active layer ACT1 of the first thin-film transistor ST1 and the second active layer ACT2 of the second thin-film transistor ST2 to form the gate insulator 130.

The first gate electrode G1 of the first thin-film transistor ST1, the second gate electrode G2 of the second thin-film transistor ST2 and the first capacitor electrode CAE1 are formed simultaneously on the gate insulator 130 by using a photolithography process.

An inorganic material is deposited on the first active layer ACT1 and the first gate electrode G1 of the first thin-film transistor ST1, the second active layer ACT2 and the second gate electrode G2 of the second thin-film transistor ST2, and the first capacitor electrode CAE1, to form the first interlayer dielectric layer 140.

The second capacitor electrode CAE2 is formed on the first interlayer dielectric layer 141 using a photolithography process.

An inorganic material is deposited on the second capacitor electrode CAE2 to form the second interlayer dielectric layer 142.

The first source electrode S1 and the first drain electrode D1 of the first thin-film transistor ST1 and the second source electrode S2 and the second drain electrode D2 of the second thin-film transistor ST2 are formed simultaneously on the second interlayer dielectric layer 142 using a photolithography process. Each of the first source electrode S1 and the first drain electrode D1 of the first thin-film transistor ST1 may be connected to the first active layer ACT1 through a contact hole formed through the gate insulator 130, the first interlayer dielectric layer 141 and the second interlayer dielectric layer 142. Each of the second source electrode S2 and the second drain electrode D2 of the second thin film transistor ST2 may be connected to the second active layer ACT2 through a contact hole formed through the gate insulator 130, the first interlayer dielectric layer 141 and the second interlayer dielectric layer 142.

An organic material is deposited on the first source electrode S1 and the first drain electrode D1 of the first thin-film transistor ST1, and the second source electrode S2 and the second drain electrode D2 of the second thin-film transistor ST2, to form the first planarization layer 150.

An anode connection electrode ANDE1 is provided or formed on the first planarization layer 150. In the first display area DA1, the anode connection electrode ANDE1 may be connected to the first drain electrode D1 of the first thin-film transistor ST1 through a contact hole formed through the first planarization layer 150. In the second display area DA2, the anode connection electrode ANDE1 may be connected to the second drain electrode D2 of the second thin film transistor ST2 through a contact hole formed through the first planarization layer 150. An organic material is deposited on the anode connection electrode ANDE1 to form the second planarization layer 160.

A barrier layer 161 is formed by depositing an inorganic material on the second planarization layer 160.

A first pixel electrode 171 and a second pixel electrode 271 are formed on the barrier layer 161 by a photolithography process. Each of the first pixel electrode 171 and the second pixel electrode 271 may be connected to the anode connection electrode ANDE1 through a contact hole formed through the second planarization layer 160 and the barrier layer 161.

The bank 180 is formed on the first pixel electrode 171, the second pixel electrode 271 and the barrier layer 161 by a photolithography process. The bank 180 may be provided or formed to cover the edge of the first pixel electrode 171, the edge of the second pixel electrode 271, and the contact hole formed through the second planarization layer 160 and the barrier layer 161.

The first emissive layer 172 may be formed on the first pixel electrode 171 by a deposition process using a mask, and a second emissive layer 272 may be provided or formed on the second pixel electrode 271.

A first common electrode 173 may be formed on the first emissive layer 172 using a photolithography process, and a second common electrode 273 may be provided or formed on the second emissive layer 272.

In the first display area DA1, the first emissive layer 172 may be aligned with each of the emission areas EA1, EA2, EA3 and EA4 using a fine metal mask. In the second display area DA2, the second emissive layer 272 may be formed using a same mask as the second common electrode 273. In such an embodiment, a feature for disconnecting the second emissive layer 272, such as a dam hole DMH, is provided in the second display area DA2. Alternatively, in the second display area DA2, the second emissive layer 272 may be aligned with each of the emission areas EA1', EA2', EA3' and EA4' using a fine metal mask. In such an embodiment, a feature for disconnecting the second emissive layer 272 may not be provided in the second display area DA2 as shown in FIG. 13.

The dam hole DMH may be formed by etching a part of the barrier layer 161 and then etching the second planarization layer 160 using the barrier layer 161 as a mask. In such an embodiment, by adjusting the etching time of the second planarization layer 160, the dam hole DMH may be formed into an undercut shape that is exposed without being covered by the second planarization layer 160 on the lower surface of the barrier layer 161.

The first floating pattern FP1, the second floating pattern FP2, the first inorganic encapsulation layer 191, and the second inorganic encapsulation layer 193 may be disposed in the dam hole DMH. In such an embodiment, the second emissive layer 272 and the second common electrode 273 may have poor step coverage. Therefore, in an embodiment where the dam hole DMH is formed into the undercut shape, the second emissive layer 272 and the second common electrode 273 may not be disposed on the sidewalls of the dam hole DMH. Accordingly, the second emissive layer 272 and the second common electrode 273 may be disconnected at the dam hole DMH. The step coverage refers to the ability of subsequent layers to evenly cover levels ("steps") already on the substrate without being disconnected.

The first floating pattern FP1 may be disposed on the second planarization layer 160 in the dam hole DMH. The first floating pattern FP1 may be a residual layer of the second emissive layer 272 that is not connected to but disconnected from the second emissive layer 272. The first floating pattern FP1 may be made of a same material as the second emissive layer 272. In an embodiment where the size of the dam hole DMH is small, the first floating pattern FP1 may not exist.

In an embodiment, the second floating pattern FP2 may be disposed on the first floating pattern FP1 in the dam hole DMH. The second floating pattern FP2 may be a residual layer of the second common electrode 273 that is not connected to but disconnected from the second common electrode 273. The second floating pattern FP2 may be made of a same material as the second common electrode 273. In an embodiment, where the size of the dam hole DMH is small, the second floating pattern FP2 may not exist.

Figure 19:
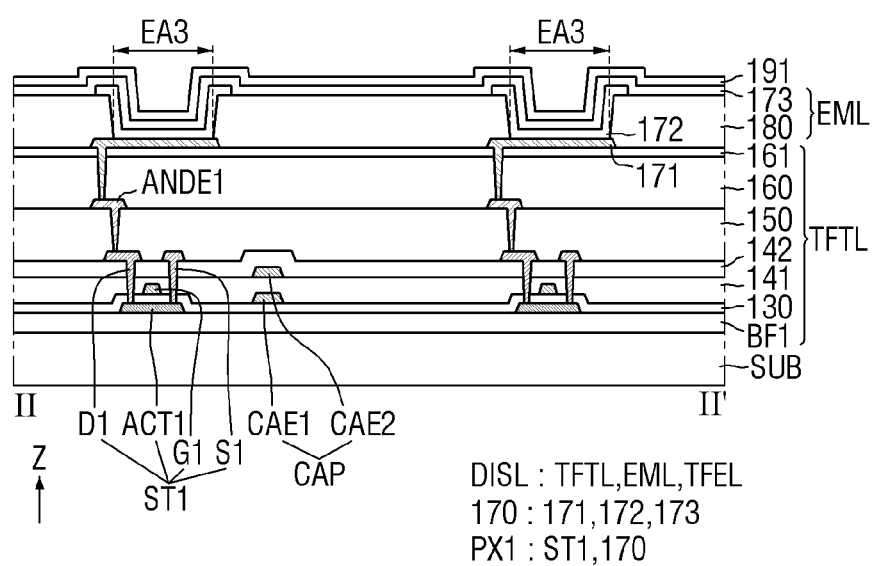
Figure 20:
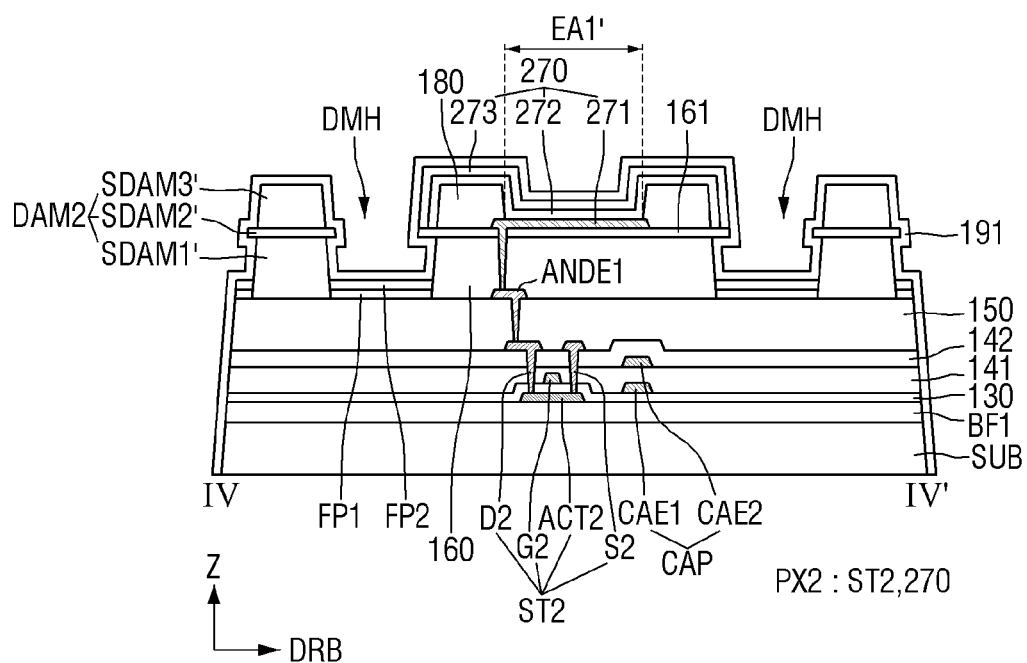

In an embodiment, as shown in FIGS. 19 and 20, an inorganic material is deposited on the first light-emitting element 170 in the first display area DA1 and the second light-emitting element 270 in the second display area DA2, to form the first inorganic encapsulation layer 191 (S200 of FIG. 16).

The first inorganic encapsulation layer 191 may be provided or formed on the first common electrode 173 of the first display area DA1 and the second common electrode 273 of the second display area DA2. In such an embodiment, the first inorganic encapsulation layer 191 may be provided or formed on the second dam DAM2 and the cut surface or side surfaces of the cut pattern CP in the second display area DA2. In such an embodiment, the first inorganic encapsulation layer 191 may be disposed on the cut surfaces or side surfaces of the substrate SUB, the first buffer layer BF1, the gate insulator 130, the first interlayer dielectric layer 141, the second interlayer dielectric layer 142, and the first planarization layer 150.

Figure 21:
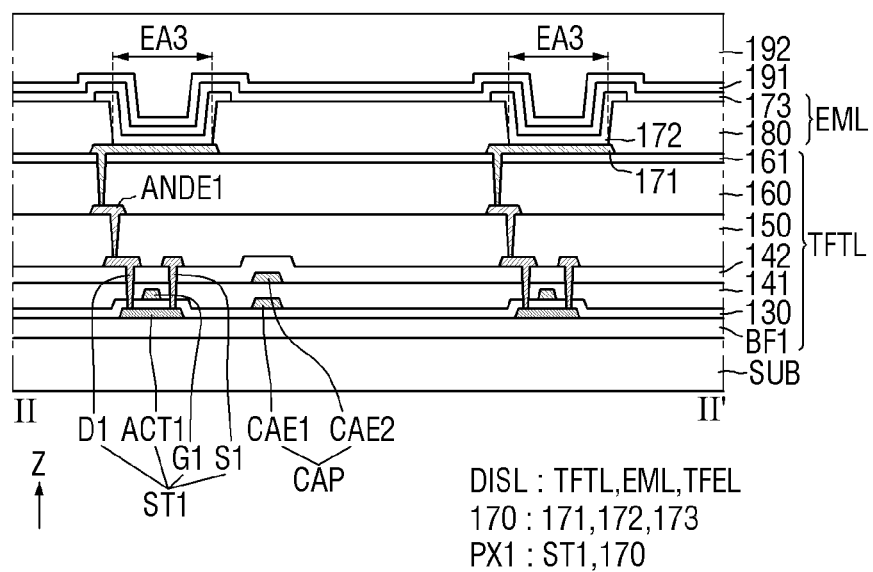

In an embodiment, as shown in FIG. 21, an organic encapsulation layer 192 is provided or formed on the first inorganic encapsulation layer 191 in the first display area DA1 (S300 of FIG. 16).

An organic encapsulation layer 192 is formed by dropping a first organic material onto the first inorganic encapsulation layer 191 in the first display area DA1 via an inkjet process. In an embodiment where the organic encapsulation layer 192 is formed via an inkjet process, the organic encapsulation layer 192 may not be effectively formed on the second pixels PX2 because the area of the cutout patterns CP of the second display area DA2 is small. If the organic encapsulation layer 192 is dropped not on the cutout pattern PC but in the cutting groove CG due to a process error, for example, the cutout patterns CP are connected by the organic encapsulation layer 192, such that the strain applied to the second display area DA2 may not be effectively reduced by the double curvature. Therefore, in such an embodiment, the organic encapsulation layer 192 may not be formed in the second display areas DA2.

Figure 22:
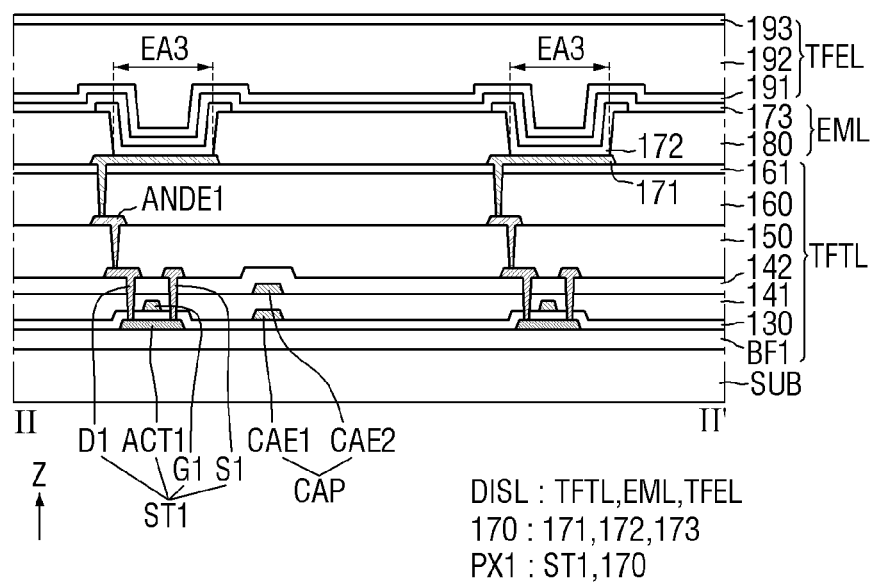
Figure 23:
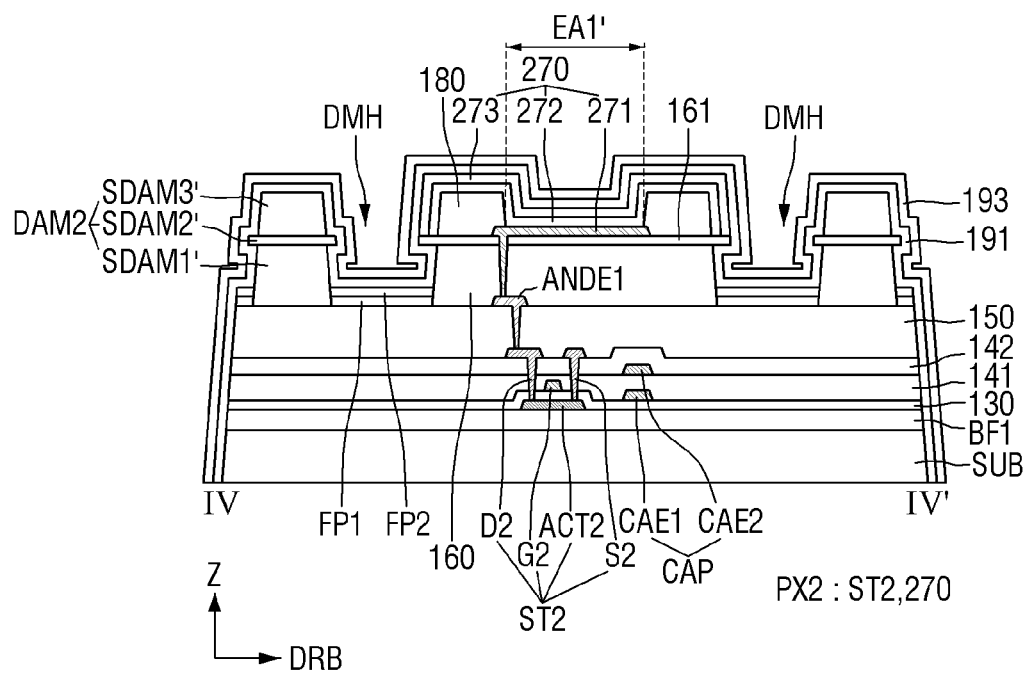

In an embodiment, as shown in FIGS. 22 and 23, an inorganic material is deposited on the organic encapsulation layer 192 in the first display area DA1 and the first inorganic encapsulation layer 191 in the second display area DA2, to form the second inorganic encapsulation layer 193 (S400 in FIG. 16).

The second inorganic encapsulation layer 193 may be provided or formed on the organic encapsulation layer 192 in the first display area DA1. Since the organic encapsulation layer 192 is not formed in the second display area DA2, the second inorganic encapsulation layer 193 may be provided or formed on the first inorganic encapsulation layer 191 in the second display area DA2. In such an embodiment, the second inorganic encapsulation layer 193 may be provided or formed on the second dam DAM2 and the cut surface or side surfaces of the cutout pattern CP in the second display area DA2. In such an embodiment, the second inorganic encapsulation layer 193 may be disposed on the cut surfaces or side surfaces of the substrate SUB, the first buffer layer BF1, the gate insulator 130, the first interlayer dielectric layer 141, the second interlayer dielectric layer 142, and the first planarization layer 150.

In an embodiment, as shown in FIGS. 24 to 27, an overcoat layer OC is provided or formed on the second inorganic encapsulation layer 193 in the first display area DA1 and the second display area DA2 (S500 of FIG. 16).

Figure 24:
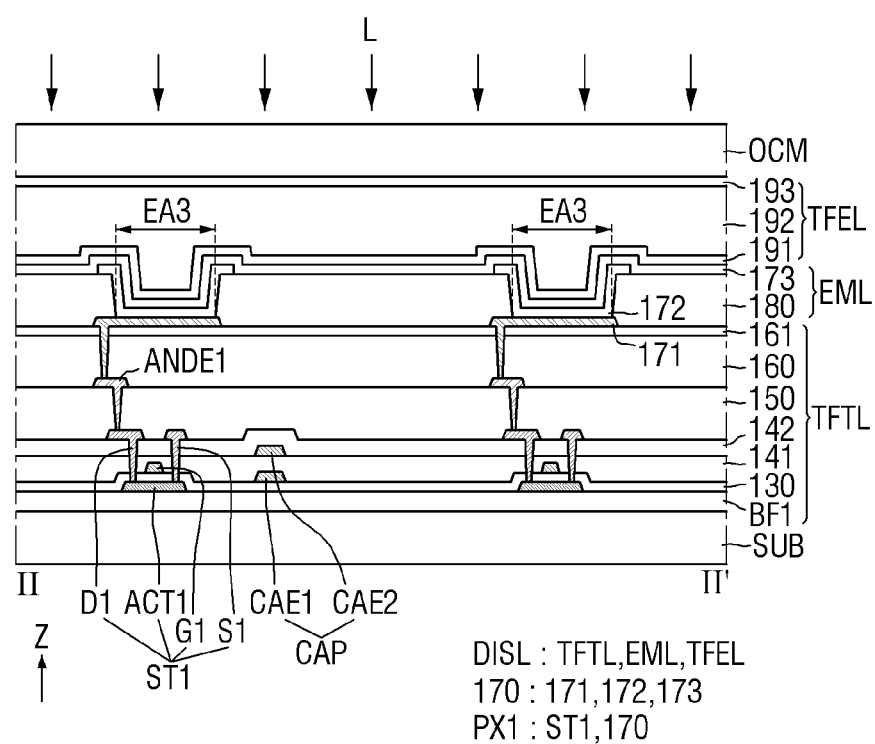
Figure 25:
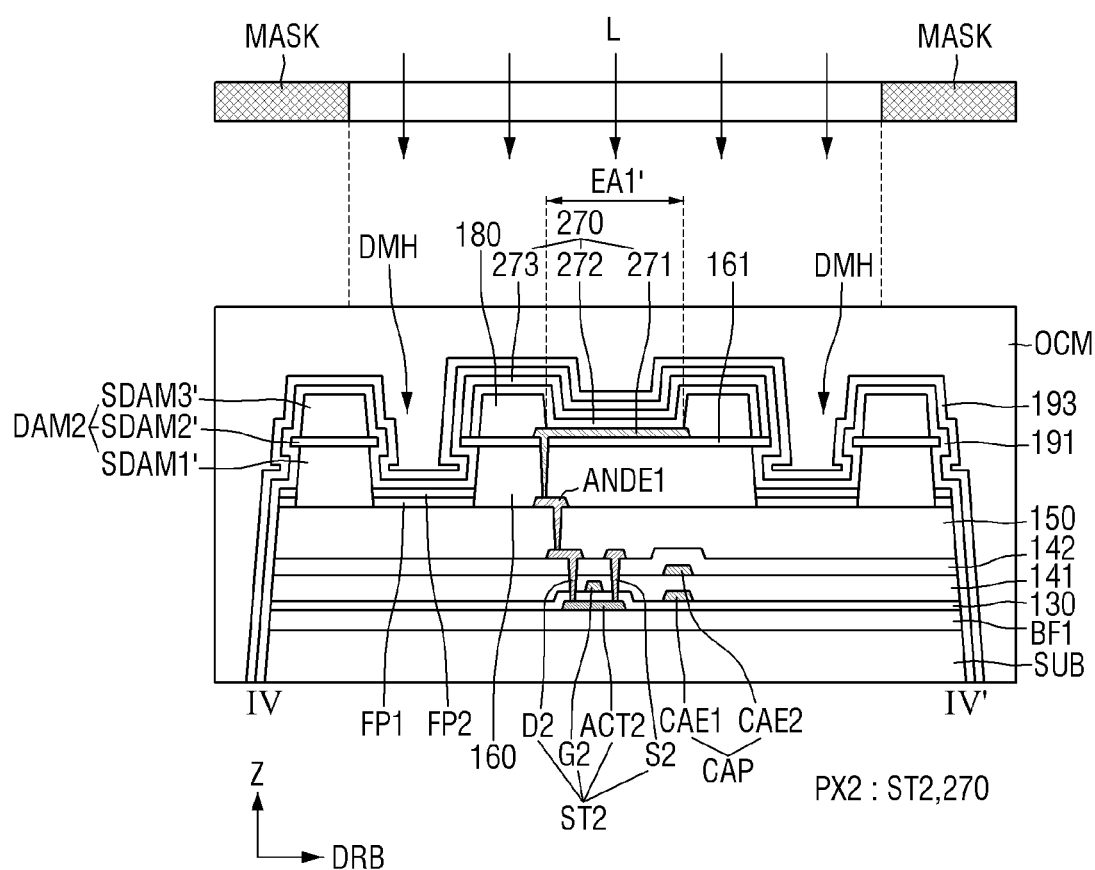
Figure 26:
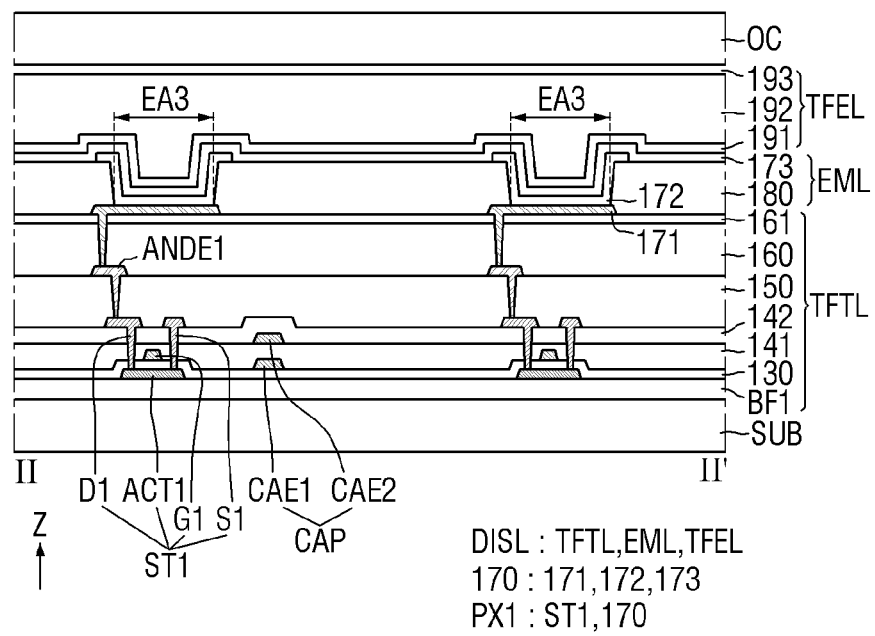
Figure 27:
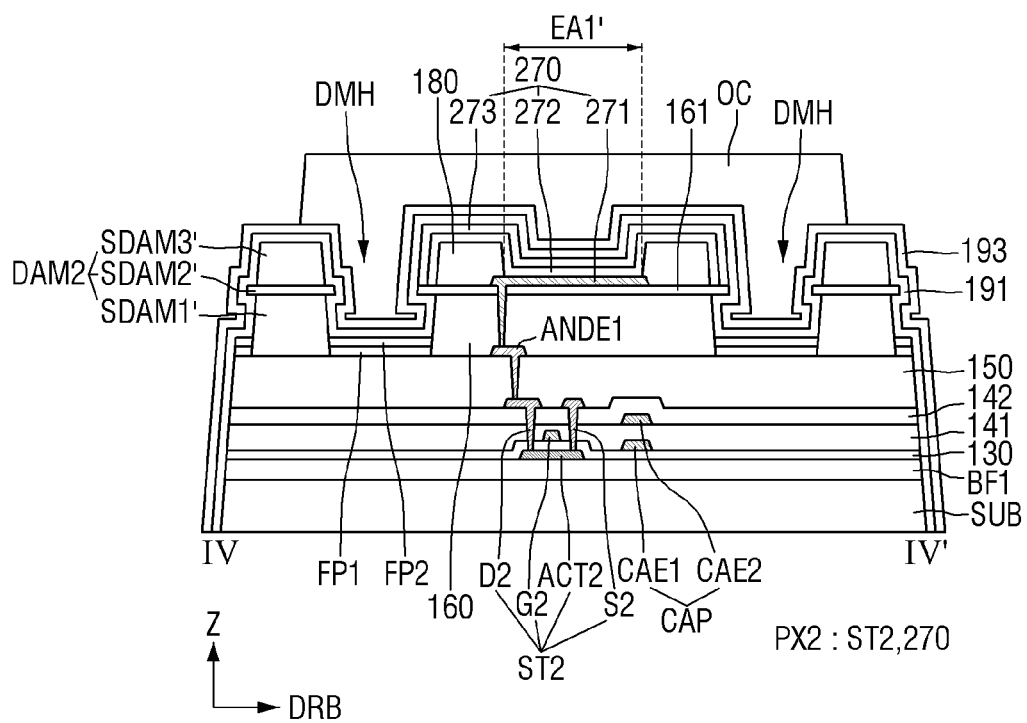

In such an embodiment, as shown in FIGS. 24 and 25, a second organic material OCM is applied on the entire upper surface of the second inorganic encapsulation layer 193 in the first display area DA1 and the second display area DA2, a mask MASK is placed above the second organic material, and then a part of the second organic material OCM is removed, to form the overcoat layer OC. In such an embodiment, the second organic material OCM may also be applied to regions between the cutout patterns CP.

The second organic material OCM shown in FIGS. 24 to 27 may be a negative photoresist pattern, i.e., a part thereof that is covered by the mask MASK not to be irradiated by light L is removed during the development process. However, the disclosure is not limited thereto. Alternatively, the second organic material OCM may be a positive photoresist pattern, i.e., a part thereof that is not covered by the mask MASK to be irradiated by light L is removed during the development process.

The overcoat layer OC may be provided or formed on the inner side of the second dam DAM2 of the second display area DA2. Since the overcoat layer OC is higher than the second inorganic encapsulation layer 193 and the first touch inorganic layer TIS1, the overcoat layer OC may serve as a particle cover layer covering particles.

While the organic encapsulation layer 192 is formed via an inkjet process, the overcoat layer OC is formed via a photolithography process, and thus the first organic material and the second organic material OCM may be made of different materials from each other.

Figure 28:
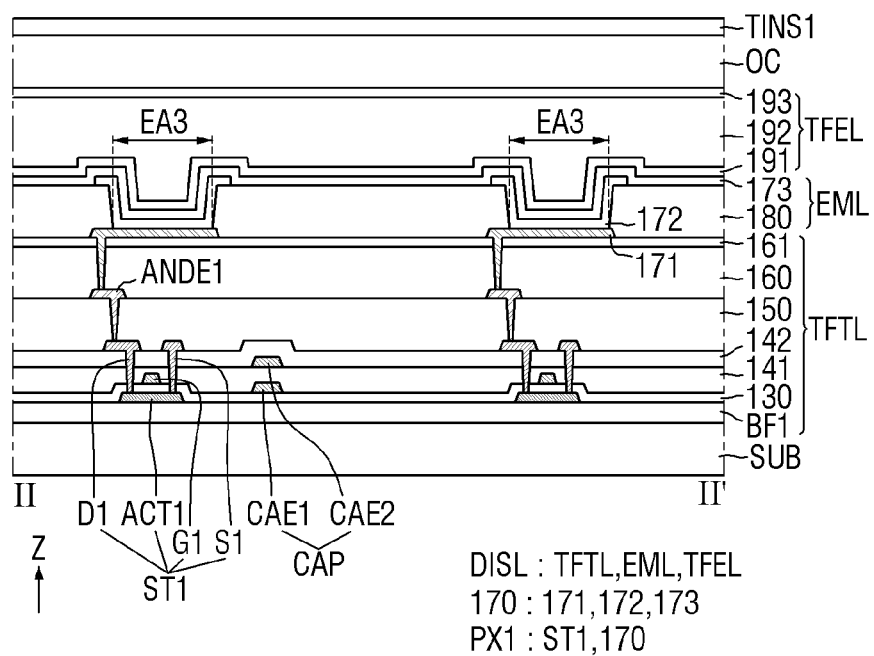
Figure 29:
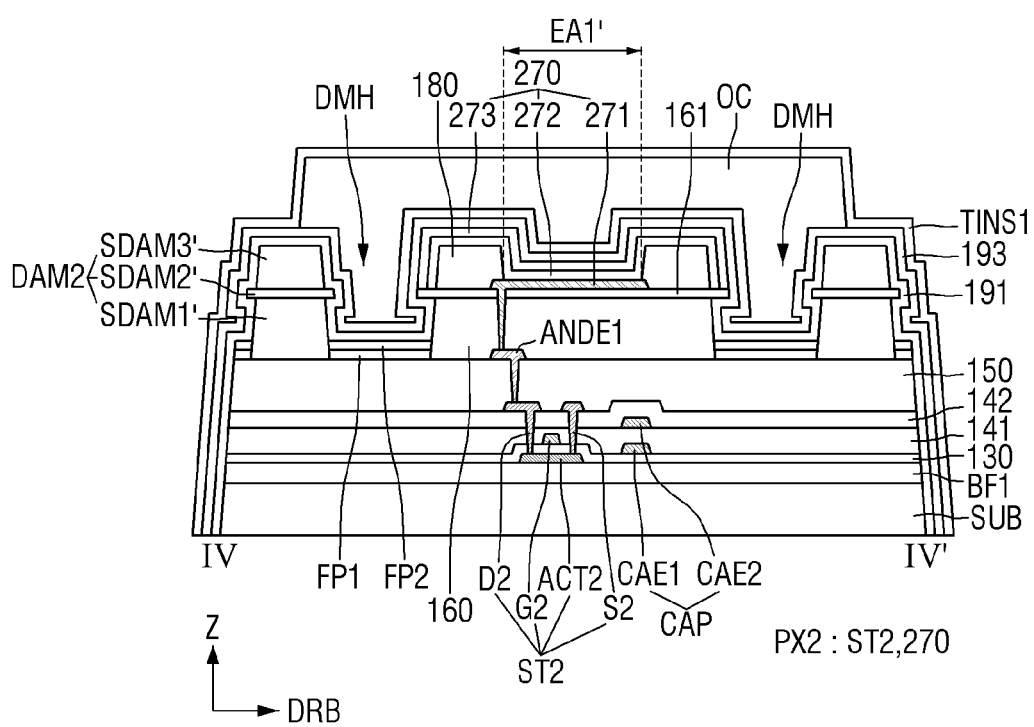

In an embodiment, as shown in FIGS. 28 and 29, the first touch inorganic layer TINS1 is formed by depositing an inorganic material on the overcoat layer OC of the first display area DA1 and the second display area DA2. (S600 in FIG. 16).

The first touch inorganic layer TINS1 may be disposed on the second dam DAM2 in the second display area DA2. Since the first touch inorganic layer TINS1 and the second inorganic encapsulation layer 193 are in contact with each other on the second dam DAM2, the second light-emitting elements 270 of the second pixels PX2 may be encapsulated by the second inorganic encapsulation layer 193 and the first touch inorganic layer TINS1.

In such an embodiment, the first touch inorganic layer TINS1 may be provided or formed on the cut surface or side surface of the cutout pattern CP. In one embodiment, for example, the first touch inorganic layer TINS1 may be disposed on the cut surfaces or side surfaces of the substrate SUB, the first buffer layer BF1, the gate insulator 130, the first interlayer dielectric layer 141, the second interlayer dielectric layer 142, and the first planarization layer 150.

Figure 30:
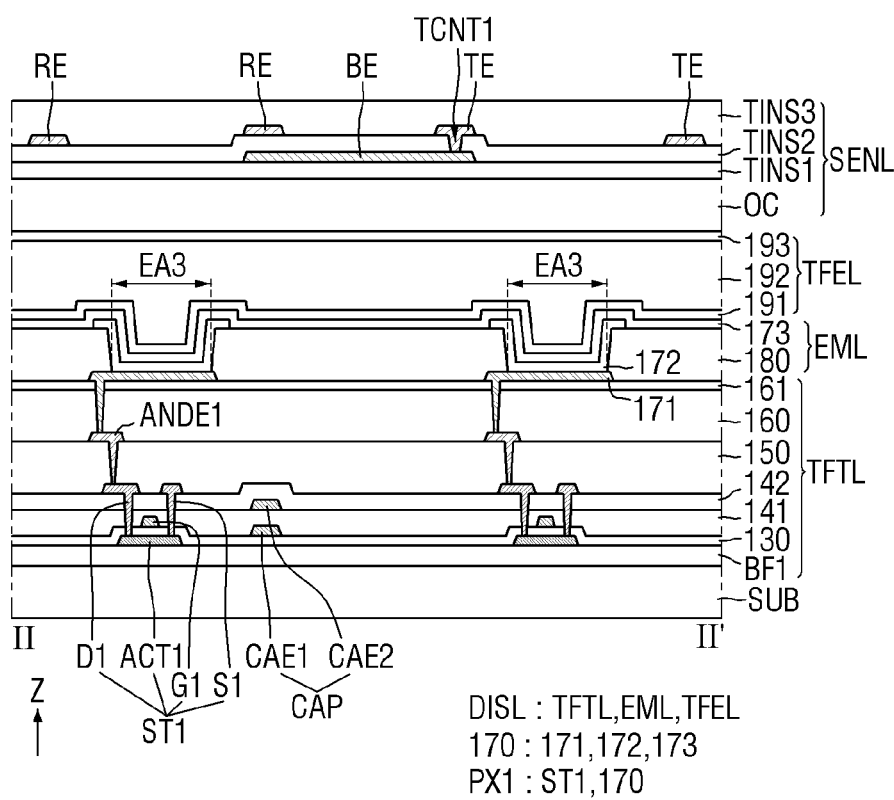

In an embodiment, as shown in FIG. 30, the connection electrode BE is provided or formed on the first touch inorganic layer TINS1 in the first display area DA1, the second touch inorganic layer TINTS2 is formed on the connection electrode BE1, and the driving electrodes TE and the sensing electrodes RE are provided or formed on the second touch inorganic layer TINS2 (S700 of FIG. 16).

The connection electrode BE is formed on the first touch inorganic layer TINS1 using a photolithography process.

An inorganic material is deposited on the connection electrode BE to form a second touch inorganic layer TINS2.

The driving electrodes TE and the sensing electrodes RE are simultaneously formed on the second touch inorganic layer TINS2 using a photolithography process.

A touch organic layer TINS3 is formed by depositing an organic material over the driving electrodes TE and the sensing electrodes RE.

In an embodiment, as shown in FIGS. 16 to 30, the organic encapsulation layer 192 is not formed in the second display areas DA2, and the overcoat layer OC formed by the photolithography process is formed on the second inorganic encapsulation layer 193 as a particle cover layer. In such an embodiment, by forming the first touch inorganic layer TINS1 on the overcoat layer OC to be in contact with the second inorganic encapsulation layer 193 on the second dam DAM2, the second light-emitting elements 270 of the second pixels PX2 may be effectively encapsulated.

In such an embodiment, since the overcoat layer OC and the first touch inorganic layer TINS1 are elements for providing the sensor electrode layer SENL, no additional fabricating process is added for encapsulating the second light-emitting elements 270 of the second pixels PX2 by the second inorganic encapsulation layer 193 and the first touch inorganic layer TINS1 in the second display areas DA2.

In such an embodiment, the third pixel PX3, the thin-film encapsulation layer TFEL and the sensor electrode layer SENL in the third display area DA3 may be fabricated in substantially a same manner as the first pixel PX1, the thin-film encapsulation layer TFEL and the sensor electrode layer SENL in the first display area DA1. Therefore, any repetitive detailed description of a method of fabricating the third pixel PX3, the thin-film encapsulation layer TFEL and the sensor electrode layer SENL in the third display area DA3 will be omitted.

In embodiments of the display device and the method for fabricating the display device according to the invention, an overcoat layer formed via a photolithography process is formed on a second inorganic encapsulation layer as a particle cover layer in a display area at a corner, instead of an organic encapsulation layer formed by an inkjet process.

In such embodiments of the display device and the method for fabricating the display device, the light-emitting elements of the pixels arranged in the display area at the corner may be effectively encapsulated by providing the first touch inorganic layer to be in contact with the second inorganic encapsulation layer formed on the overcoat layer.

In such embodiments of the display device and the method for fabricating the display device, an overcoat layer and a first touch inorganic layer are elements for forming a sensor electrode layer in a display area disposed on the front surface, and thus the particle cover layer and encapsulation structure in the display area of the corner may be effectively provided without using an additional fabricating process.

The invention should not be construed as being limited to the embodiments set forth herein. Rather, these embodiments are provided so that this invention will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention.

What is claimed is:

1. A display device comprising:
   a substrate comprising a front surface, a first side surface extending from a first side of the front surface, a second side surface extending from a second side of the front surface, and a corner disposed between the first side surface and the second side surface;
   a first display area disposed at the front surface of the substrate, wherein the first display area includes a first pixel including a first pixel electrode, a first emissive layer disposed on the first pixel electrode, and a first common electrode disposed on the first emissive layer;
   a second display area disposed at the corner of the substrate, wherein the second display area includes a second pixel including a second pixel electrode, a second emissive layer disposed on the second pixel electrode, and a second common electrode disposed on the second emissive layer;
   a first inorganic encapsulation layer disposed on the first common electrode in the first display area and the second common electrode in the second display area;
   an organic encapsulation layer disposed on the first inorganic encapsulation layer in the first display area; and
   a second inorganic encapsulation layer disposed on the organic encapsulation layer in the first display area and on the first inorganic encapsulation layer in the second display area.

2. The display device of claim 1, further comprising:
   an overcoat layer disposed on the second inorganic encapsulation layer in the first display area and the second display area; and
   a first touch inorganic layer disposed on the overcoat layer in the first display area and the second display area.

3. The display device of claim 2, wherein the organic encapsulation layer includes a different material from the overcoat layer.

4. The display device of claim 2, further comprising:
   a connection electrode disposed on the first touch inorganic layer in the first display area;
   a second touch inorganic layer disposed on the connection electrode in the first display area; and
   a sensor electrode disposed on the second touch inorganic layer in the first display area.

5. The display device of claim 4, wherein
   the sensor electrode comprises a driving electrode and a sensing electrode,
   wherein the driving electrode is connected to the connection electrode through a touch contact hole defined through the second touch inorganic layer.

6. The display device of claim 4, further comprising:
   a touch organic layer disposed on the sensor electrode in the first display area.

7. The display device of claim 2, further comprising:
   a cutout pattern disposed at the corner of the substrate, separated from another cutout pattern by a cutting groove, wherein the cutout pattern includes the second pixel.

8. The display device of claim 7, further comprising:
   a dam disposed on the cutout pattern and surrounding the second pixel.

9. The display device of claim 8, wherein the second inorganic encapsulation layer and the first touch inorganic layer are in contact with each other on the dam in the second display area.

10. The display device of claim 8, wherein
    the second pixel includes a plurality of emission areas, and
    wherein a dam hole is defined between the dam and one of the plurality of emission areas.

11. The display device of claim 10, wherein the dam hole is filled with the overcoat layer.

12. The display device of claim 10, further comprising:
    a transistor disposed on the corner of the substrate in the second display area;
    a planarization layer disposed on the transistor; and
    a barrier layer disposed on the planarization layer,
    wherein the dam hole is defined through the planarization layer and the barrier layer.

13. The display device of claim 12, wherein the dam hole is formed into an undercut shape.

14. The display device of claim 12, further comprising:
    a first floating pattern disposed in the dam hole; and
    a second floating pattern disposed on the first floating pattern,
    wherein the first inorganic encapsulation layer is disposed on the second floating pattern in the dam hole.

15. The display device of claim 14, wherein
    the first floating pattern is spaced apart from the second emissive layer,
    the first floating pattern includes a same material as the second emissive layer, and
    wherein the second floating pattern is spaced apart from the second common electrode and includes a same material as the second common electrode.

16. The display device of claim 7, wherein at least one selected from the first inorganic encapsulation layer, the second inorganic encapsulation layer, and the first touch inorganic layer is disposed on a side surface of the cutout pattern.

17. A method of fabricating a display device, the method comprising:
- providing a first pixel in a first display area and a second pixel in a second display area on a substrate, wherein the first pixel includes a first pixel electrode, a first emissive layer disposed on the first pixel electrode and a first common electrode disposed on the first emissive layer, and the second pixel includes a second pixel electrode, a second emissive layer disposed on the second pixel electrode and a second common electrode disposed on the second emissive layer;
- providing a first inorganic encapsulation layer on the first common electrode and the second common electrode;
- providing an organic encapsulation layer on the first inorganic encapsulation layer in the first display area; and
- providing a second inorganic encapsulation layer on the organic encapsulation layer in the first display area and the first inorganic encapsulation layer in the second display area.

18. The method of claim 17, wherein the providing the organic encapsulation layer includes dropping a first organic material onto the first inorganic encapsulation layer in the first display area by an inkjet process to form the organic encapsulation layer.

19. The method of claim 18, further comprising:
- providing an overcoat layer on the second inorganic encapsulation layer in the first display area and the second display area; and
- providing a first touch inorganic layer on the overcoat layer in the first display area and the second display area.

20. The method of claim 19, wherein the providing the overcoat layer includes applying a second organic material onto the second inorganic encapsulation layer in the first display area and the second display area to form the overcoat layer using a photolithography process.

21. The display device of claim 20, wherein the first organic material is different from the second organic material.

* * * * *